(12) United States Patent
Mihara et al.

(10) Patent No.: US 7,183,639 B2
(45) Date of Patent: Feb. 27, 2007

(54) SEMICONDUCTOR DEVICE AND METHOD OF MANUFACTURING THE SAME

(75) Inventors: Ichiro Mihara, Tachikawa (JP); Takeshi Wakabayashi, Sayama (JP); Toshihiro Kido, Ome (JP); Hiroyasu Jobetto, Hachioji (JP); Yutaka Yoshino, Isesaki (JP); Nobuyuki Kageyama, Saitama (JP); Daita Kohno, Itako (JP); Jun Yoshizawa, Isesaki (JP)

(73) Assignees: Casio Computer Co., Ltd., Tokyo (JP); CMK Corporation, Tokyo (JP)

( * ) Notice: Subject to any disclaimer, the term of this patent is extended or adjusted under 35 U.S.C. 154(b) by 0 days.

(21) Appl. No.: 10/916,917

(22) Filed: Aug. 12, 2004

(65) Prior Publication Data

US 2005/0051886 A1  Mar. 10, 2005

Related U.S. Application Data

(63) Continuation of application No. PCT/JP2004/000338, filed on Jan. 16, 2004.

(30) Foreign Application Priority Data

Jan. 16, 2003 (JP) ............................ 2003-008551
Jan. 16, 2003 (JP) ............................ 2003-008552

(51) Int. Cl.
*H01L 23/48* (2006.01)
(52) U.S. Cl. ...................................... 257/690; 257/773
(58) Field of Classification Search ................ 257/690, 257/620, 773, 780
See application file for complete search history.

(56) References Cited

U.S. PATENT DOCUMENTS

| 6,467,674 | B1 | 10/2002 | Mihara |
| 6,486,005 | B1 | 11/2002 | Kim |
| 6,657,295 | B2 | 12/2003 | Araki |
| 6,749,927 | B2 | 6/2004 | Cooray |
| 6,882,054 | B2 | 4/2005 | Jobetto |
| 2002/0038890 | A1 | 4/2002 | Ohuchi |
| 2005/0051886 | A1* | 3/2005 | Mihara et al. ............... 257/690 |
| 2005/0146051 | A1 | 7/2005 | Jobetto |

FOREIGN PATENT DOCUMENTS

| JP | 11-233678 A | 8/1999 |
| JP | 2001-326299 A | 11/2001 |
| JP | 2001-332643 A | 11/2001 |
| JP | 2002-016173 A | 1/2002 |
| JP | 2002-084074 A | 3/2002 |
| JP | 2002-231854 A | 8/2002 |
| JP | 2002-246755 A | 8/2002 |
| JP | 2002-246756 A | 8/2002 |

* cited by examiner

*Primary Examiner*—Mark V. Prenty
(74) *Attorney, Agent, or Firm*—Frishauf, Holtz, Goodman & Chick, P.C.

(57) ABSTRACT

A semiconductor device includes at least one semiconductor structure which has a plurality of external connection electrodes formed on a semiconductor substrate. An insulating sheet member is arranged on the side of the semiconductor structure. Upper interconnections have connection pad portions that are arranged on the insulating sheet member in correspondence with the upper interconnections and connected to the external connection electrodes of the semiconductor structure.

36 Claims, 50 Drawing Sheets

SEMICONDUCTOR DEVICE AND METHOD OF MANUFACTURING THE SAME

CROSS-REFERENCE TO RELATED APPLICATIONS

This is a Continuation Application of PCT Application No. PCT/JP2004/000338, filed Jan. 16, 2004, which was published under PCT Article 21(2) in English.

This application is based upon and claims the benefit of priority from prior Japanese Patent Applications No. 2003-008551, filed Jan. 16, 2003; and No. 2003-008552, filed Jan. 16, 2003, the entire contents of both of which are incorporated herein by reference.

BACKGROUND OF THE INVENTION

1. Field of the Invention

The present invention relates to a semiconductor device and, more particularly, to a semiconductor device that belongs to a small semiconductor package called a CSP (Chip Size Package) and a method of manufacturing the same.

2. Description of the Related Art

In recent years, semiconductor devices called CSP (Chip Size Package) have been developed as portable electronic devices represented by cellular phones decrease their sizes. In a CSP, a passivation film (intermediate insulating film) is formed on the upper surface of a bare semiconductor device having a plurality of connection pads for external connection. Opening portions are formed in the passivation film in correspondence with the connection pads. Interconnections are connected to one-terminal sides the connection pads at through the opening portions. Columnar electrodes for external connection are formed on the other-terminal sides of the interconnections. The spaces between the columnar electrodes for external connection are filled with a sealing material. According to this CSP, when solder balls are formed on the columnar electrodes for external connection, the device can be bonded to a circuit board with connection terminals by the face-down method. The mounting area can be almost the same as the size of the bare semiconductor device. The CSP can therefore greatly decrease the sizes of electronic devices as compared to the conventional face-up bonding method using wire bonding. U.S. Pat. No. 6,467,674 discloses a method in which, to increase the productivity, a passivation film, interconnections, external connection electrodes, and a sealing material are formed on a semiconductor substrate in a wafer state. After solder balls are formed on the upper surfaces of the external connection electrodes that are exposed without being covered with the sealing material. Then, the wafer is cut along dicing lines to form individual semiconductor devices.

The conventional semiconductor device raises the following problems when the number of external connection electrodes increases as the degree of integration becomes higher. As described above, in a CSP, the external connection electrodes are arrayed on the upper surface of a bare semiconductor device. Hence, the external connection electrodes are normally arrayed in a matrix. In a semiconductor device having many external connection electrodes, the size and pitch of the external connection electrodes become extremely small. Because of this disadvantage, the CSP technology cannot be applied to devices that have a large number of external connection electrodes relative to the size of the bare semiconductor device. If the external connection electrodes have extremely small size and pitch, alignment to the circuit board is difficult. There are also many fatal problems such as a low bonding strength, short circuit between electrodes in bonding, and destruction of external connection electrodes which is caused by stress generated due to the difference in coefficient of linear expansion between the circuit board and the semiconductor substrate normally formed from a silicon substrate.

BRIEF SUMMARY OF THE INVENTION

It is an object of the present invention to provide a novel semiconductor device which can ensure necessary size and pitch of external connection electrodes even when the number of electrodes increases, and a method of manufacturing the same.

According to an aspect of the present invention, there is provided a semiconductor device comprising at least one semiconductor structure which has a semiconductor substrate and a plurality of external connection electrodes formed on the semiconductor substrate, an insulating sheet member arranged on a side of the semiconductor structure, and a plurality of upper interconnections which have connection pad portions that are arranged on the insulating sheet member in correspondence with the upper interconnections and electrically connected to the external connection electrodes of the semiconductor structure.

According to another aspect of the present invention, there is provided a semiconductor device manufacturing method comprising arranging, on a base plate, a plurality of semiconductor structures each having a semiconductor substrate and a plurality of connection pads while separating the semiconductor structures from each other, and arranging at least one insulating sheet member having opening portions at positions corresponding to the semiconductor structures, heating and pressing the insulating sheet member from an upper side of the insulating sheet member to melt and set the insulating sheet member between the semiconductor structures, forming at least one layer of an upper interconnection which has a connection pad portion and is connected to a corresponding one of the connection pads of one of the semiconductor structures so as to arrange the connection pad portion on the insulating sheet member in correspondence with the upper interconnection, and cutting the insulating sheet member between the semiconductor structures to obtain a plurality of semiconductor devices in which the connection pad portion of the upper interconnection is arranged on the insulating sheet member.

DETAILED DESCRIPTION OF THE INVENTION (First Embodiment)

Figure 1:
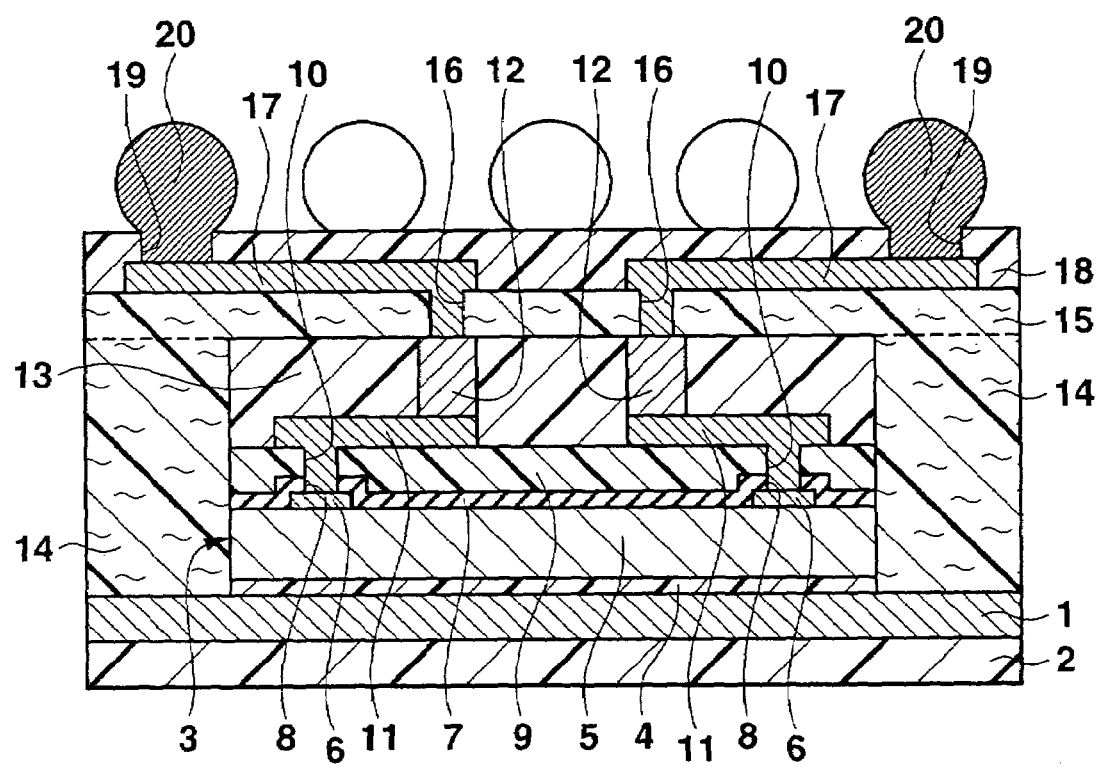
FIG. 1 is a sectional view of a semiconductor device according to the first embodiment of the present invention.

FIG. 1 is a sectional view of a semiconductor device according to the first embodiment of the present invention. This semiconductor device has a metal layer 1 which has a rectangular planar shape and is made of copper or the like, and an insulating layer 2 which is formed on the lower surface of the metal layer 1 and made of a solder resist. The metal layer 1 prevents electrification or light irradiation on the integrated circuit of a silicon substrate 5 (to be described later). The insulating layer 2 protects the metal layer 1.

The lower surface of a semiconductor structure 3 which has a rectangular planar shape and is slightly smaller than the metal layer 1 is bonded to the central portion of the upper surface of the metal layer 1 via an adhesive layer 4 made of a die bonding material. The semiconductor structure 3 has interconnections, columnar electrodes, and a sealing film (to be described later) and is generally called a CSP. Especially, since a method of forming the interconnections, columnar electrodes, and sealing film on a silicon wafer and then executing dicing to obtain individual semiconductor structures 3 is employed, as will be described later, the semiconductor structure 3 is also particularly called a wafer-level CSP (W-CSP). The structure of the semiconductor structure 3 will be described below.

The semiconductor structure 3 has the silicon substrate (semiconductor substrate) 5 having a rectangular planar shape and is bonded to the metal layer 1 via the adhesive layer 4. An integrated circuit (not shown) is formed at the central portion of the upper surface of the silicon substrate 5. A plurality of connection pads (external connection electrodes) 6 which are made of an aluminum-based metal and connected to the integrated circuit are formed at the peripheral portion of the upper surface of the silicon substrate 5. An insulating film 7 made of silicon oxide is formed on the upper surface of the silicon substrate 5 and the connection pads 6 except the central portion of each connection pad.

The central portion of each connection pad 6 is exposed through an opening portion 8 formed in the insulating film 7.

A protective film (insulating film) 9 made of epoxy resin or polyimide resin is formed on the upper surface of the insulating film 7 formed on the silicon substrate 5. Opening portions 10 are formed in the protective film 9 at positions corresponding to the opening portions 8 of the insulating film 7. An interconnection 11 made of copper extends from the upper surface of each connection pad 6 exposed through the opening portions 8 and 10 to a predetermined part of the upper surface of the protective film 9.

A columnar electrode (external connection electrode) 12 made of copper is formed on the upper surface of the connection pad portion of each interconnection 11. A sealing film (insulating film) 13 made of epoxy resin or polyimide resin is formed on the upper surfaces of the protective film 9 and the interconnections 11. The upper surface of the sealing film 13 is flush with those of the columnar electrodes 12. As described above, the semiconductor structure 3 called a W-CSP includes the silicon substrate 5, connection pads 6, and insulating film 7 and also includes the protective film 9, interconnections 11, columnar electrodes 12, and sealing film 13.

A first insulating material (insulating sheet member) 14 having a rectangular frame shape is arranged on the upper surface of the metal layer 1 around the semiconductor structure 3. The upper surface of the first insulating material 14 is almost flush with that of the semiconductor structure 3. A second insulating material 15 having a flat upper surface is arranged on the upper surfaces of the semiconductor structure 3 and first insulating material 14.

The first insulating material 14 is normally called a prepreg material which is prepared by, e.g., impregnating glass fibers with a thermosetting resin such as epoxy resin. The second insulating material 15 is normally called a build-up material which is used for a build-up substrate. The second insulating material 15 is made of a thermosetting resin such as epoxy resin or BT (Bismaleimide Triazine) resin containing a reinforcing material such as fibers or fillers. In this case, the fiber is preferably glass fiber or aramid fiber. The filler is preferably silica filler or ceramic filler.

Opening portions 16 are formed in the second insulating material 15 at positions corresponding to the central portions of the upper surfaces of the columnar electrodes 12. Upper interconnections 17 made of copper are arranged in a matrix. Each upper interconnection 17 extends from the upper surface of a corresponding one of the columnar electrodes 12, which is exposed from the upper surface of the insulating material 15 through the opening portion 16, to a predetermined part of the upper surface of the second insulating material 15.

An upper insulating film 18 made of a solder resist is formed on the upper surfaces of the upper interconnections 17 and second insulating material 15. Opening portions 19 are formed in the upper insulating film 18 at positions corresponding to the connection pad portions of the upper interconnections 17. Projecting electrodes 20 formed from solder balls are formed in and on the opening portions 19 and electrically (and mechanically) connected to the connection pad portions of the upper interconnections 17. The projecting electrodes 20 are arranged in a matrix on the upper insulating film 18.

The size of the metal layer 1 is slightly larger than that of the semiconductor structure 3. The reason for this is as follows. The arrangement region of the projecting electrodes 20 is made slightly larger than the size of the semiconductor structure 3 as the number of connection pads 6 on the silicon substrate 5 increases. Accordingly, the size and pitch of the connection pad portions of the upper interconnections 17 (the portions in the opening portions 19 of the upper insulating film 18) are made larger than those of the columnar electrodes 12.

Hence, the connection pad portions of the upper interconnections 17 arranged in a matrix are mounted not only on a region corresponding to the semiconductor structure 3 but also on a region corresponding to the first insulating material 14 arranged outside the outer side surface of the semiconductor structure 3. That is, of the projecting electrodes 20 arranged in a matrix, at least the projecting electrodes 20 at the outermost positions are arranged around the semiconductor structure 3.

As described above, as a characteristic feature of this semiconductor device, the first and second insulating members 14 and 15 are arranged around and on the semiconductor structure 3 in which not only the connection pads 6 and insulating film 7 but also the protective film 9, interconnections 11, columnar electrodes 12, and sealing film 13 are formed on the silicon substrate 5. The upper interconnections 17 connected to the columnar electrodes 12 through the opening portions 16 formed in the second insulating material 15 are formed on the upper surface of the second insulating material 15.

In the above structure, the upper surface of the second insulating material 15 is flat. For this reason, the height positions of the upper surfaces of the upper interconnections 17 and projecting electrodes 20, which are formed in subsequent steps, can be uniformed, and the reliability of bonding can be increased.

Figure 2:
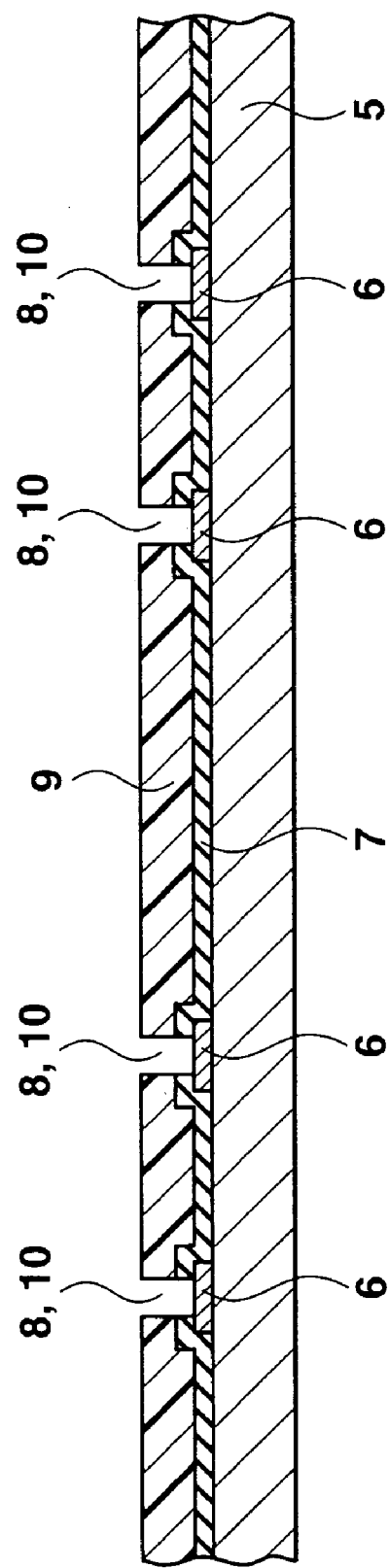
FIG. 2 is a sectional view of an initially prepared structure in an example of a method of manufacturing the semiconductor device shown in FIG. 1.

An example of a method of manufacturing the semiconductor device will be described next. First, an example of a method of manufacturing the semiconductor structure 3 will be described. In this case, as shown in FIG. 2, an assembly structure is prepared, in which connection pads 6 made of an aluminum-based metal, an insulating film 7 made of silicon oxide, and a protective film 9 made of epoxy resin or polyimide resin are formed on the silicon substrate (semiconductor substrate) 5 in a wafer state, and the central portions of the connection pads 6 are exposed through opening portions 8 and 10 formed in the insulating film 7 and protective film 9. In the above structure, an integrated circuit having a predetermined function is formed in a region of the silicon substrate 5 in the wafer state, where each semiconductor structure should be formed. Each connection pad 6 is electrically connected to the integrated circuit formed in a corresponding region.

Figure 3:
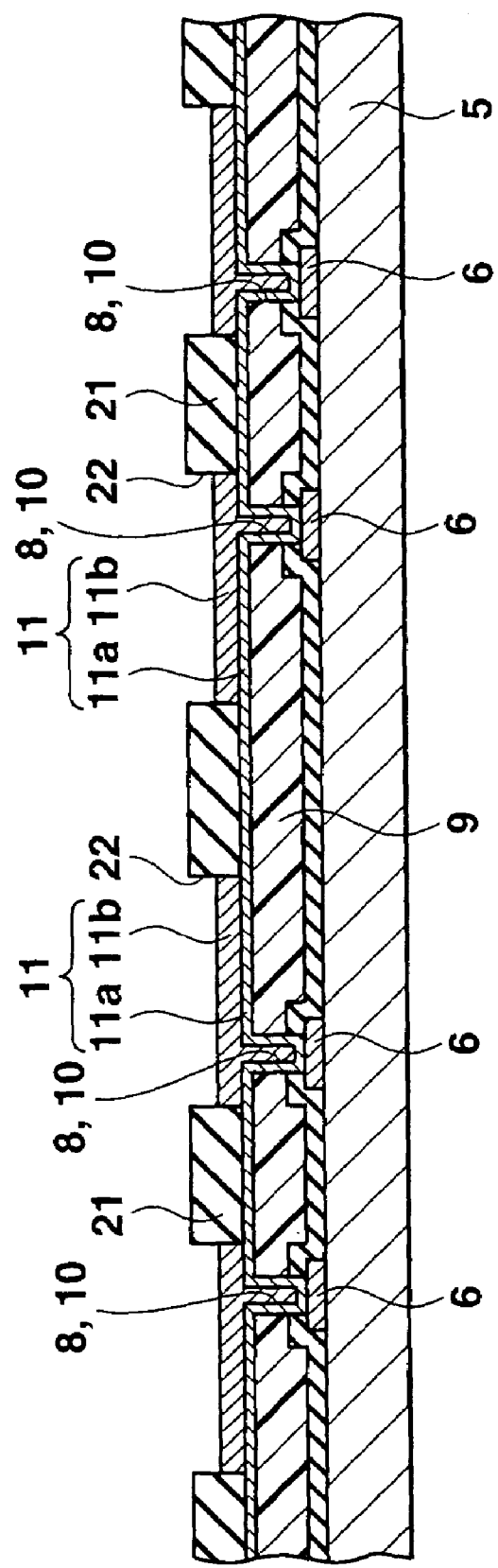
FIG. 3 is a sectional view showing a manufacturing step following FIG. 2.

Next, as shown in FIG. 3, a lower metal layer 11*a* is formed on the entire upper surface of the protective film 9, including the upper surfaces of the connection pads 6 exposed through the opening portions 8 and 10. In this case, the lower metal layer 11*a* may have only a copper layer formed by electroless plating or only a copper layer formed by sputtering. Alternatively, a copper layer may be formed by sputtering on a thin titanium layer formed by sputtering. This also applies to the lower metal layers of the upper interconnections 17 (to be described later).

Next, a plating resist film 21 is formed on the upper surface of the lower metal layer 11*a* and patterned. In this case, the patterned resist film 21 has an opening portion 22 at a position corresponding to the formation region of each interconnection 11. Copper electroplating is executed using the lower metal layer 11*a* as a plating current path to form an upper metal layer 11*b* on the upper surface of the lower metal layer 11a in each opening portion 22 of the plating resist film 21. Then, the plating resist film 21 is removed.

Figure 4:
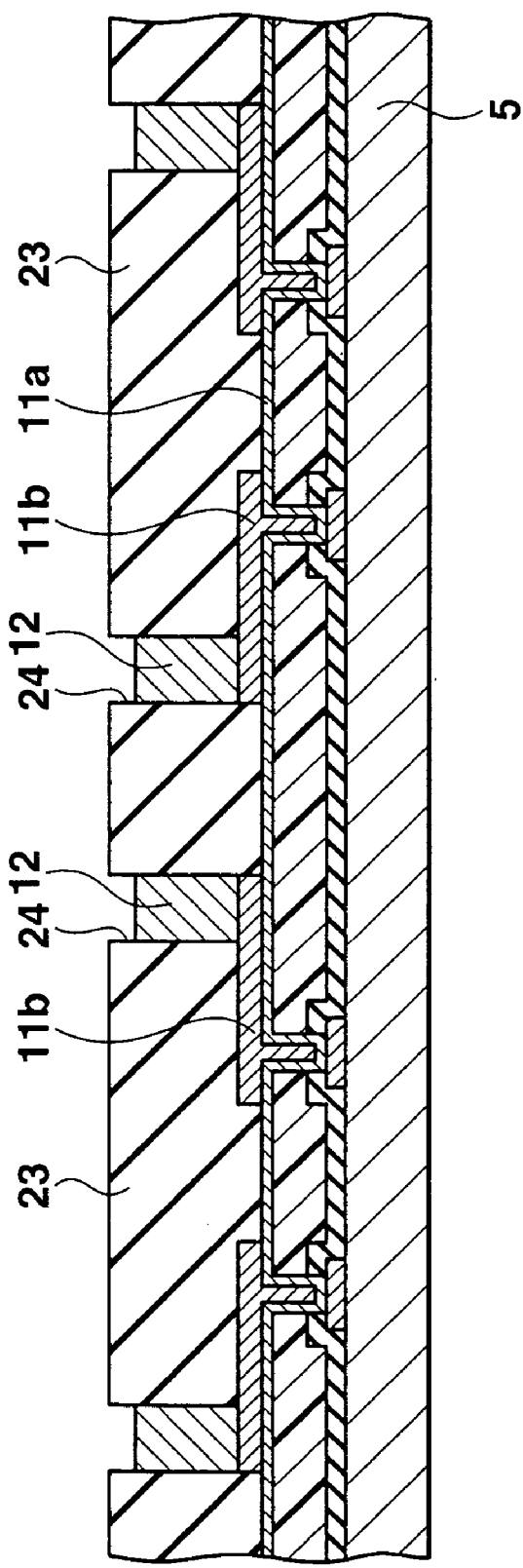
FIG. 4 is a sectional view showing a manufacturing step following FIG. 3.

As shown in FIG. 4, a plating resist film 23 is formed on the upper surface of the lower metal layer 11a including the upper metal layers 11b and patterned. In this case, the patterned resist film 23 has an opening portion 24 at a position corresponding to the formation region of each columnar electrode 12. Copper electroplating is executed using the lower metal layer 11a as a plating current path to form a columnar electrode 12 on the upper surface of the connection pad portion of the upper metal layer 11b in each opening portion 24 of the plating resist film 23.

Figure 5:
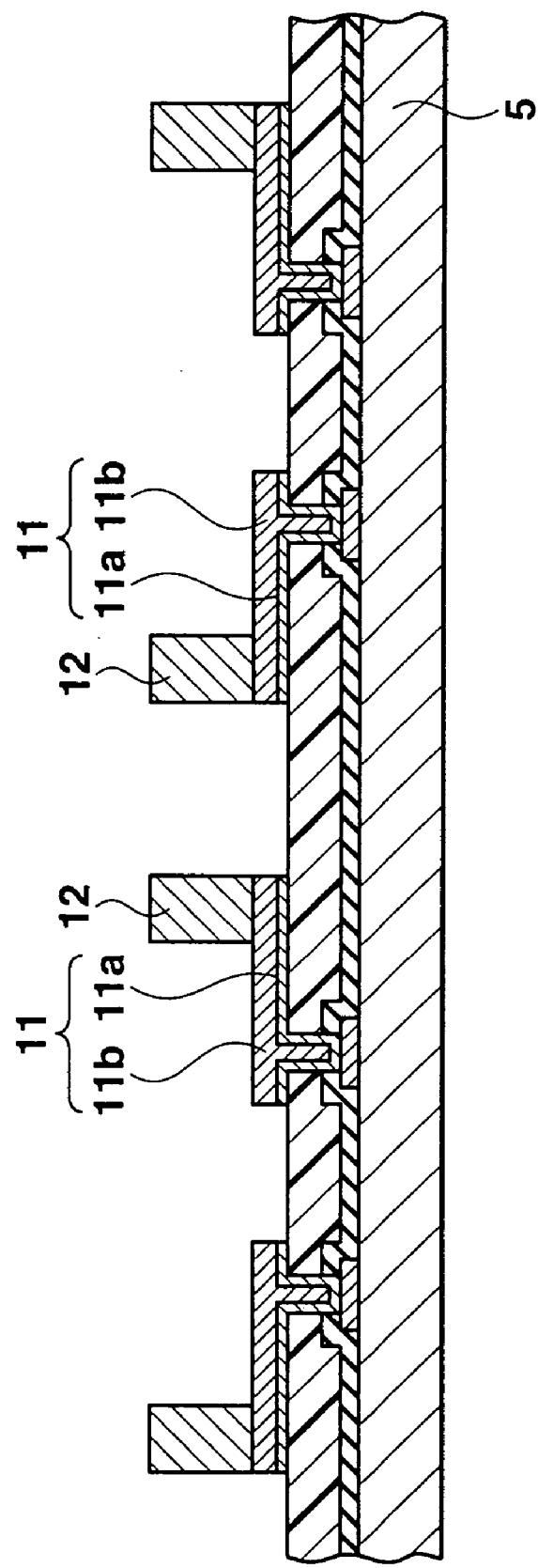
FIG. 5 is a sectional view showing a manufacturing step following FIG. 4.

Next, the plating resist film 23 is removed. Then, unnecessary portions of the lower metal layer 11a are removed by etching using the columnar electrodes 12 and upper metal layers 11b as a mask so that the lower metal layers 11a are left only under the upper metal layers 11b, as shown in FIG. 5. Each left lower metal layer 11a and the upper metal layer 11b formed on the entire upper surface of the lower metal layer 11a construct the interconnection 11.

Figure 6:
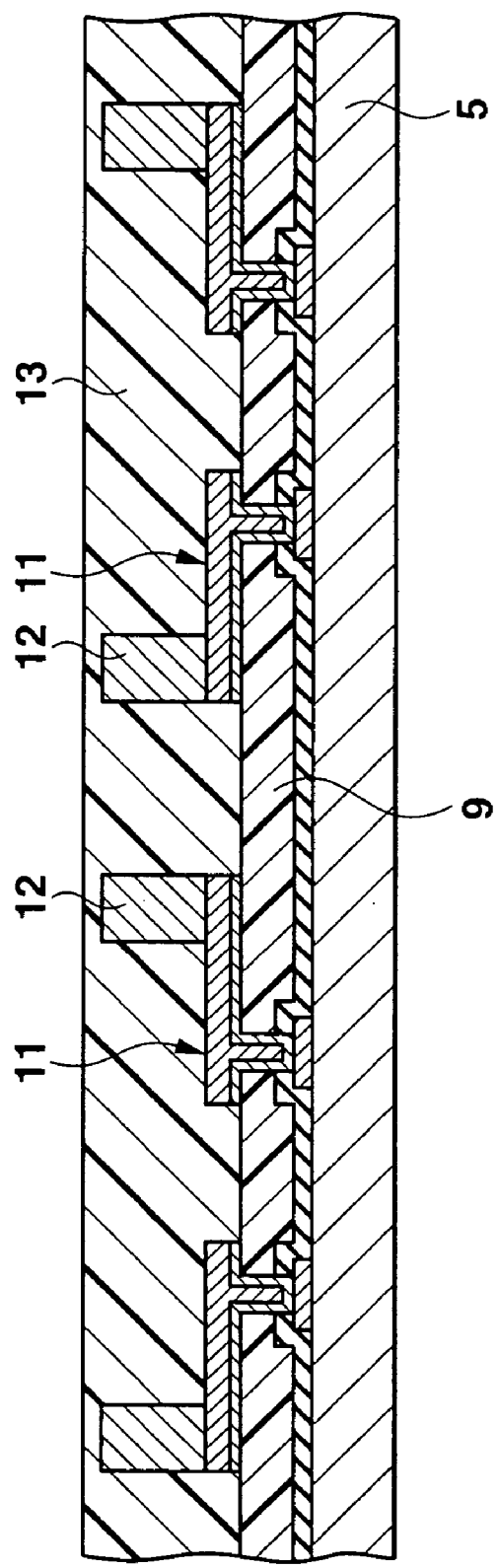
FIG. 6 is a sectional view showing a manufacturing step following FIG. 5.
Figure 7:
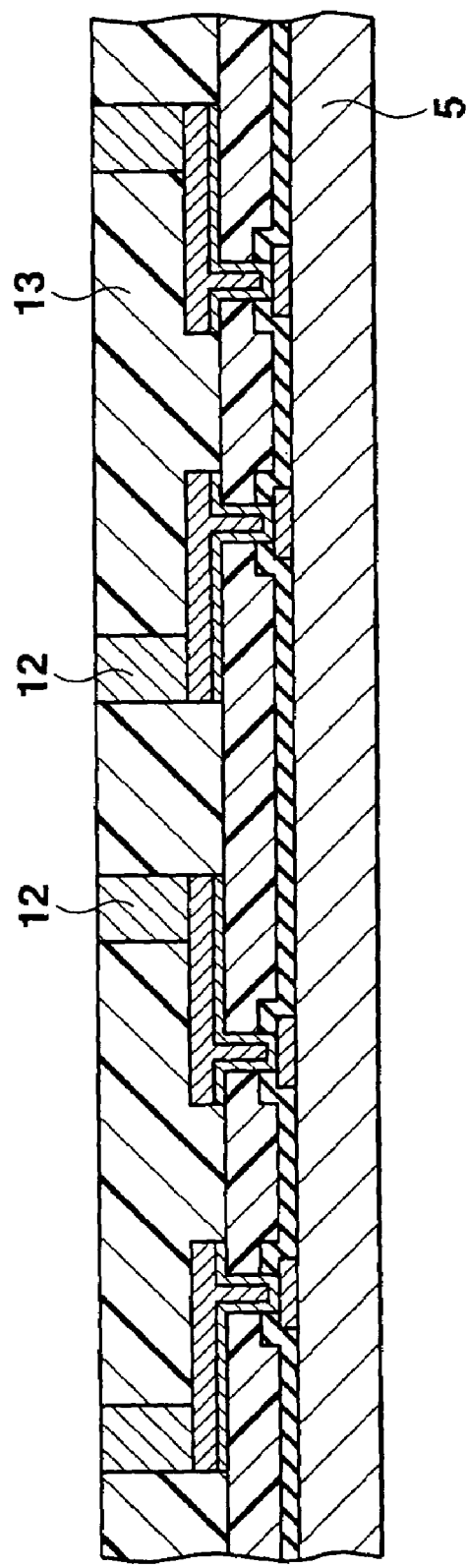
FIG. 7 is a sectional view showing a manufacturing step following FIG. 6.

As shown in FIG. 6, a sealing film 13 made of epoxy resin or polyimide resin is formed on the entire upper surfaces of the protective film 9, the columnar electrodes 12 and interconnections 11 by screen printing, spin coating, or die coating. The sealing film 13 has a thickness more than the height of the columnar electrodes 12. Hence, in this state, the upper surfaces of the columnar electrodes 12 are covered with the sealing film 13. The upper surface side of the sealing film 13 and columnar electrodes 12 is appropriately polished to expose the upper surfaces of the columnar electrodes 12, as shown in FIG. 7. The upper surface of the sealing film 13 including the exposed upper surfaces of the columnar electrodes 12 is also planarized.

The reason why the upper surface side of the columnar electrodes 12 is appropriately polished is that the heights of the columnar electrodes 12 formed by electroplating have a variation and need to be uniformed by canceling the variation. To simultaneously polish the columnar electrodes 12 made of soft copper and the sealing film 13 made of epoxy resin or the like, a grinder having a grindstone with an appropriate roughness is used.

Figure 8:
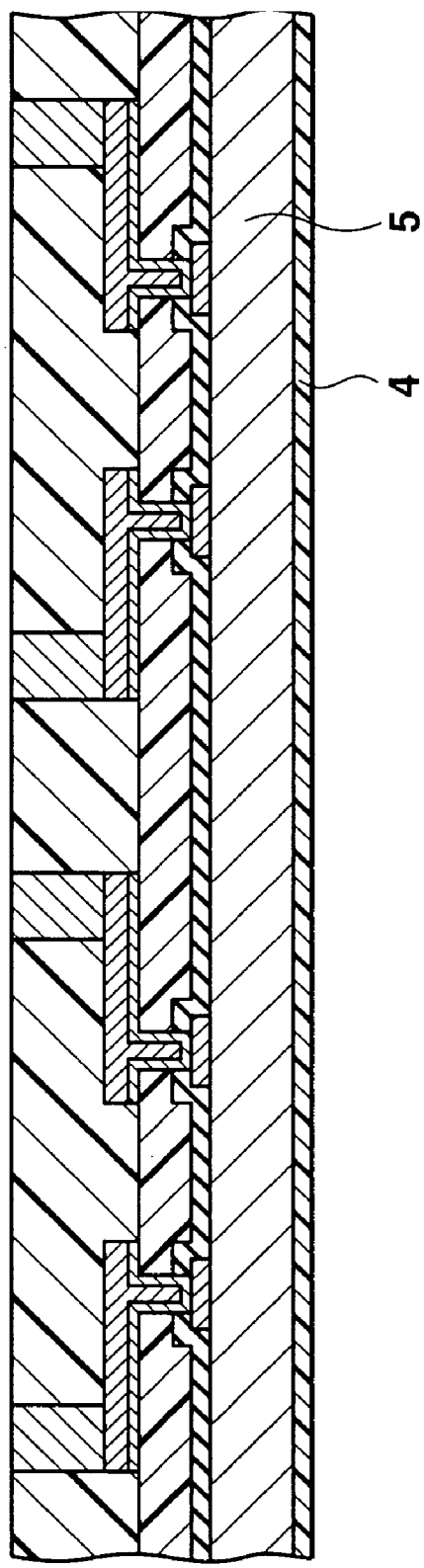
FIG. 8 is a sectional view showing a manufacturing step following FIG. 7.
Figure 9:
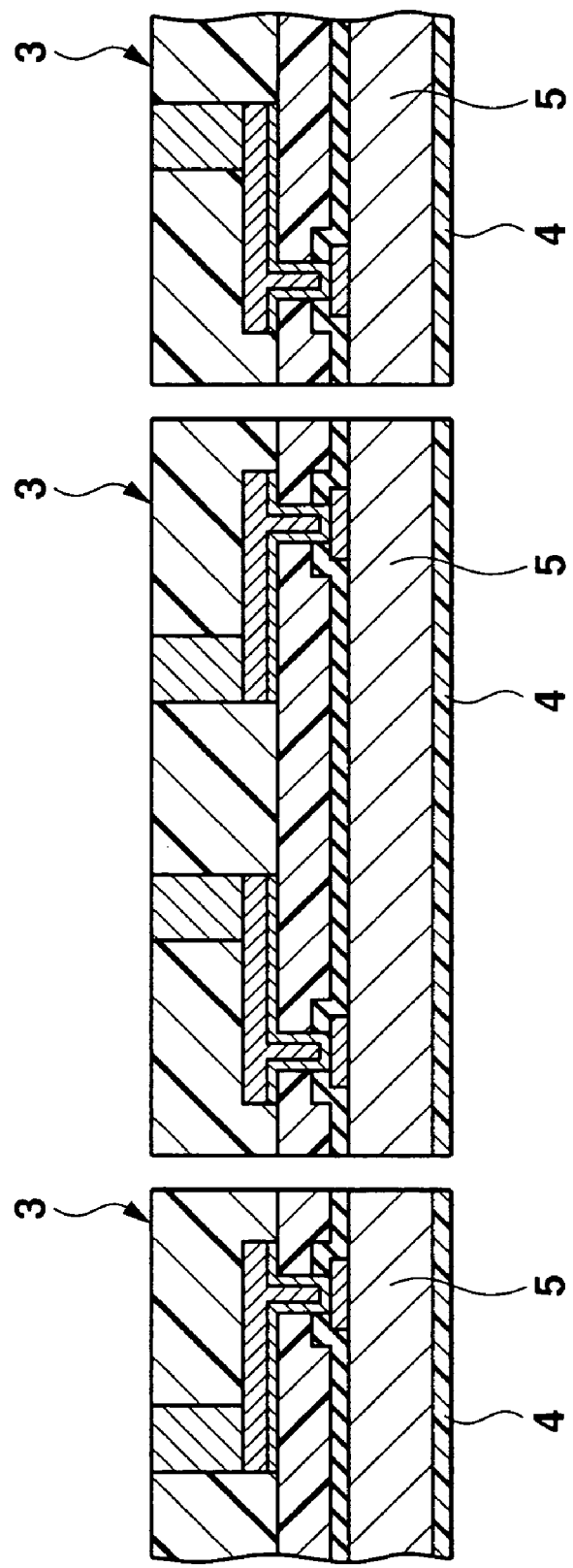
FIG. 9 is a sectional view showing a manufacturing step following FIG. 8.

As shown in FIG. 8, an adhesive layer 4 is bonded to the entire lower surface of the silicon substrate 5. The adhesive layer 4 is made of a die bonding material such as epoxy resin or polyimide resin and sticks to the silicon substrate 5 in a temporarily set state by heating and pressing. Next, the adhesive layer 4 sticking to the silicon substrate 5 is bonded to a dicing tape (not shown). After a dicing step shown in FIG. 9, the respective structures are peeled from the dicing tape. Accordingly, a plurality of semiconductor structures 3 each having the adhesive layer 4 on the lower surface of the silicon substrate 5, as shown in FIG. 1, are obtained.

In the semiconductor structure 3 thus obtained, the adhesive layer 4 exists on the lower surface of the silicon substrate 5. Hence, the very cumbersome operation for forming an adhesive layer on the lower surface of the silicon substrate 5 of each semiconductor structure 3 after the dicing step is unnecessary. The operation for peeling off each semiconductor structure from the dicing tape after the dicing step is much simpler than the operation for forming an adhesive layer on the lower surface of the silicon substrate 5 of each semiconductor structure 3 after the dicing step.

Figure 10:
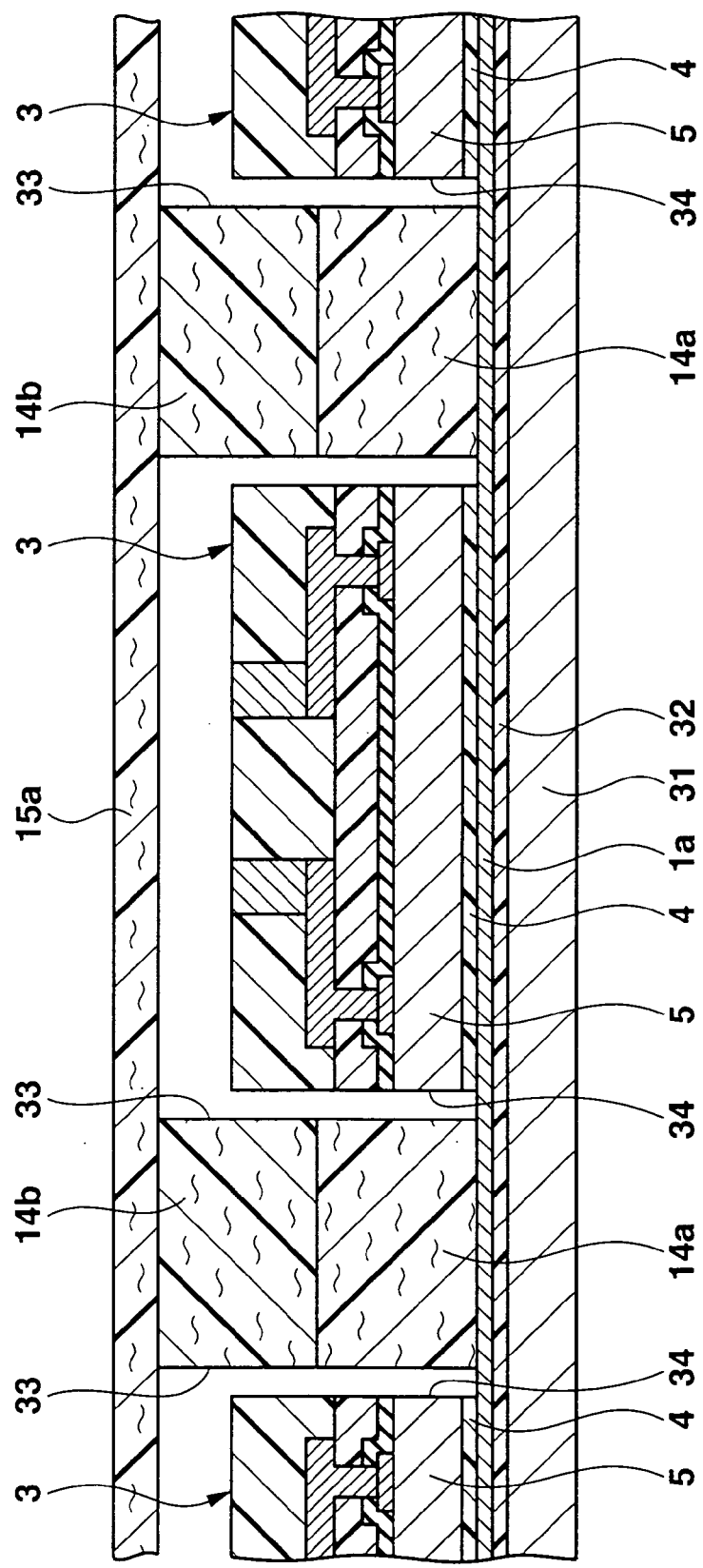
FIG. 10 is a sectional view showing a manufacturing step following FIG. 9.

An example will be described next, in which the semiconductor device shown in FIG. 1 is manufactured using the semiconductor structure 3 obtained in the above way. First, as shown in FIG. 10, a base plate 31 is prepared. The base plate 31 is so large that a plurality of copper foils that construct the upper surface side of the metal layer 1 shown in FIG. 1, as will be described later, can be sampled. The base plate 31 has a rectangular planar shape and, more preferably, an almost square planar shape, though its shape is not limited. A copper foil 1a is bonded to the upper surface of the base plate 31 via an adhesive layer 32.

The base plate 31 can be made of an insulating material such as glass, ceramic, or a resin. In this case, a base plate made of aluminum is used as an example. As for sizes, the base plate 31 made of aluminum has a thickness of about 0.4 mm, and the copper foil 1a has a thickness of about 0.012 mm. The base plate 31 is used because the copper foil 1a is too thin and cannot serve as a base plate. The copper foil 1a serves as an antistatic member during the manufacturing step.

Next, the adhesive layers 4 bonded to the lower surfaces of the silicon substrates 5 of the semiconductor structures 3 are bonded to a plurality of predetermined portions of the upper surface of the copper foil 1a. In this bonding process, the adhesive layer 4 is finally set by heating and pressing. Two first insulating sheet members 14a and 14b each having opening portions arrayed in a matrix are aligned and stacked on the upper surface of the copper foil 1a between the semiconductor structures 3 and outside those arranged at the outermost positions. A second insulating sheet member 15a is placed on the upper surface of the first insulating sheet member 14b. The semiconductor structures 3 may be arranged after the two first insulating sheet members 14a and 14b are stacked and arranged.

The first insulating sheet members 14a and 14b each having a matrix shape can be obtained in the following way. Glass fiber is impregnated with a thermosetting resin such as epoxy resin. The thermosetting resin is semi-set to prepare a sheet-shaped prepreg material. A plurality of rectangular opening portions 33 are formed in the prepreg material by die cutting or etching. In this case, to obtain flatness, each of the first insulating sheet members 14a and 14b must be a sheet-shaped member. However, the material need not always be a prepreg material. A thermosetting resin or a thermosetting resin in which a reinforcing material such as glass fiber or silica filler is dispersed may be used.

The second insulating sheet member 15a is not limited to but is preferably made of a build-up material. As the build-up material, a thermosetting resin such as epoxy resin or BT resin, which is mixed with a silica filler and semi-set, can be used. However, as the second insulating sheet member 15a, the above-described prepreg material or a material containing no filler or containing only a thermosetting resin may be used.

The size of the opening portion 33 of the first insulating sheet members 14a and 14b is slightly larger than that of the semiconductor structure 3. For this reason, gaps 34 are formed between the first insulating sheet members 14a and 14b and the semiconductor structures 3. The length of the gap 34 is, e.g., about 0.1 to 0.5 mm. The total thickness of the first insulating sheet members 14a and 14b is larger than the thickness of the semiconductor structure 3. The first insulating sheet members 14a and 14b are thick enough to sufficiently fill the gaps 34 when the first insulating sheet members are heated and pressed, as will be described later.

In this case, the first insulating sheet members 14a and 14b having the same thickness are used. However, the first insulating sheet members 14a and 14b may have different thicknesses. The first insulating sheet member may include two layers, as described above. However, it may include one layer or three or more layers. The thickness of the second insulating sheet member 15a corresponds to or is slightly larger than the thickness of the second insulating material 15 to be formed on the semiconductor structure 3 in FIG. 1.

Figure 11:
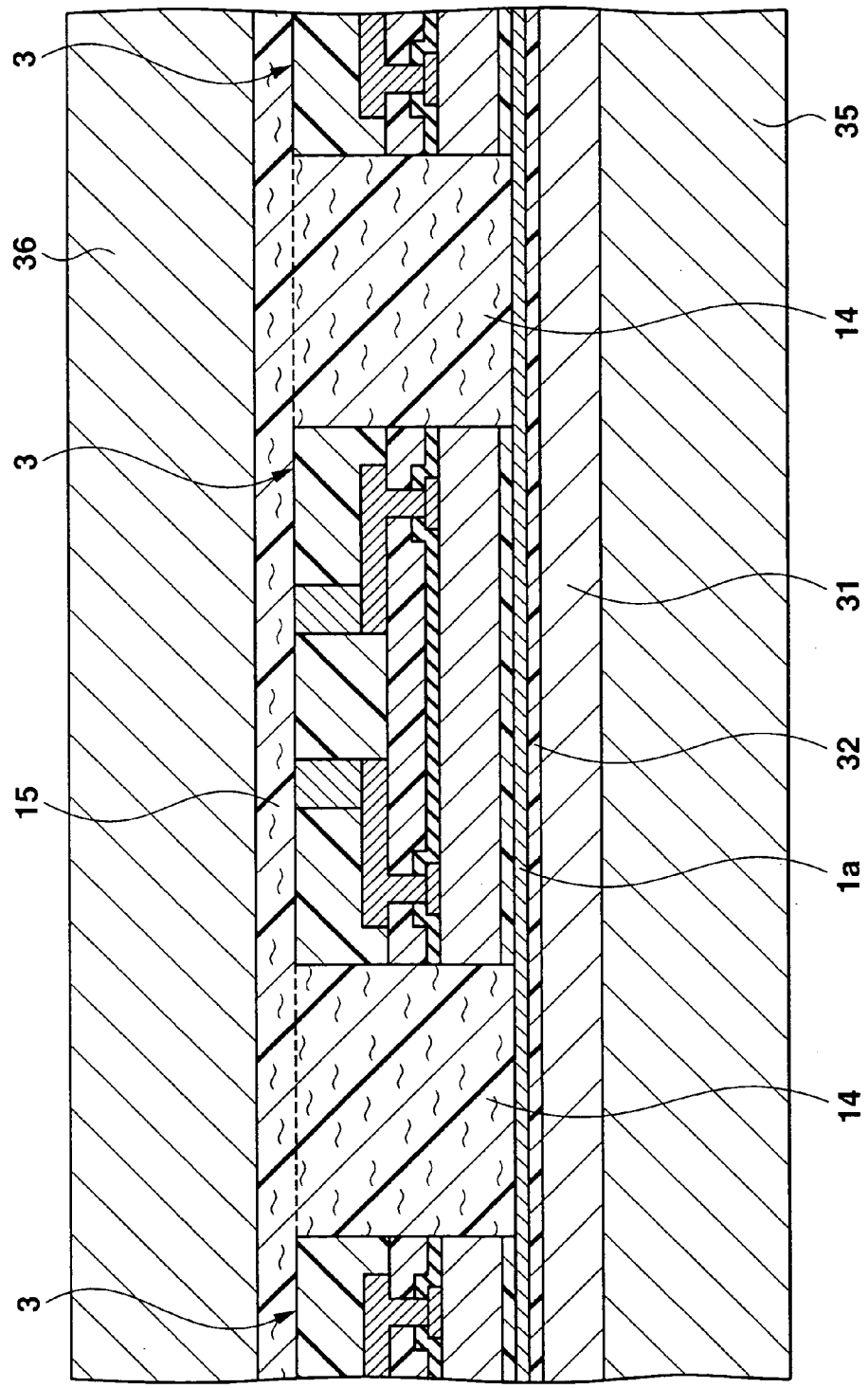
FIG. 11 is a sectional view showing a manufacturing step following FIG. 10.

Next, the first insulating sheet members 14*a* and 14*b* and second insulating sheet member 15*a* are heated and pressed by using a pair of heating/pressing plates 35 and 36 shown in FIG. 11. Accordingly, the melted thermosetting resin in the first insulating sheet members 14*a* and 14*b* is squeezed to fill the gaps 34, shown in FIG. 10, between the first insulating sheet members 14*a* and 14*b* and the semiconductor structures 3. With a subsequent cooling process, the thermosetting resin is set while sticking to the semiconductor structures 3 and the copper foil 1*a* between them. In this way, as shown in FIG. 11, a first insulating material 14 made of a thermosetting resin containing a reinforcing material, which sticks to the base plate 31, is formed on the upper surface of the copper foil 1*a* between the semiconductor structures 3 and outside those arranged at the outermost positions. In addition, the second insulating material 15 made of a thermosetting resin containing a reinforcing material is formed on the upper surfaces of the semiconductor structures 3 and first insulating material 14.

In this case, as shown in FIG. 7, in the wafer state, the columnar electrodes 12 in each semiconductor structure 3 have a uniform height. In addition, the upper surface of the sealing film 13 including the upper surfaces of the columnar electrodes 12 is planarized. For this reason, in the state shown in FIG. 11, the plurality of semiconductor structures 3 have the same thickness.

In the state shown in FIG. 11, heating and pressing are performed while defining, as a press limit surface, a virtual plane higher than the upper surface of the semiconductor structure 3 by the diameter of the reinforcing material (e.g., silica filler) of one layer. The second insulating material 15 on the semiconductor structures 3 obtains a thickness equal to the diameter of the reinforcing material (e.g., silica filler). When an open-ended (open) flat press is used as a press having the pair of heating/pressing plates 35 and 36, the excess thermosetting resin in the insulating sheet members 14*a*, 14*b*, and 15*a* is squeezed out of the pair of heating/pressing plates 35 and 36.

The upper surface of the second insulating material 15 is a flat surface because it is pressed by the lower surface of the heating/pressing plate 36 on the upper side. Hence, the polishing step of planarizing the upper surface of the second insulating material 15 is unnecessary. Even when the copper foil 1*a* has a relatively large size of, e.g., about 500×500 mm, the second insulating material 15 can easily be planarized at once with respect to the plurality of semiconductor structures 3 arranged on the copper foil 1*a*.

The first and second insulating materials 14 and 15 are made of a thermosetting resin containing a reinforcing material such as a fiber or filler. For this reason, as compared to a structure made of only a thermosetting resin, stress due to shrinkage in setting the thermosetting resin can be reduced. This also prevents the copper foil 1*a* from warping.

In the manufacturing step shown in FIG. 11, heating and pressing may be executed by separate means. That is, for example, pressing is executed only from the upper surface side while the lower surface side of the semiconductor structures 3 is heated by a heater. Alternatively, heating and pressing may be executed in separate steps.

When the manufacturing step shown in FIG. 11 is ended, the first and second insulating materials 14 and 15, the semiconductor structures 3, and the copper foil 1*a* are integrated. They alone can maintain a necessary strength. Next, the base plate 31 and adhesive layer 32 are peeled or removed by polishing or etching. This process is done to reduce the load in dicing (to be described later) and reduce the thickness of the semiconductor device as a product. In the manufacturing step shown in FIG. 10, when the insulating sheet members 14*a*, 14*b*, and 15*a* are temporarily set by temporary contact bonding and temporarily bonded to the upper surface of the copper foil 1*a*, the base plate 31 and adhesive layer 32 may be peeled or removed by polishing or etching after this step.

Figure 12:
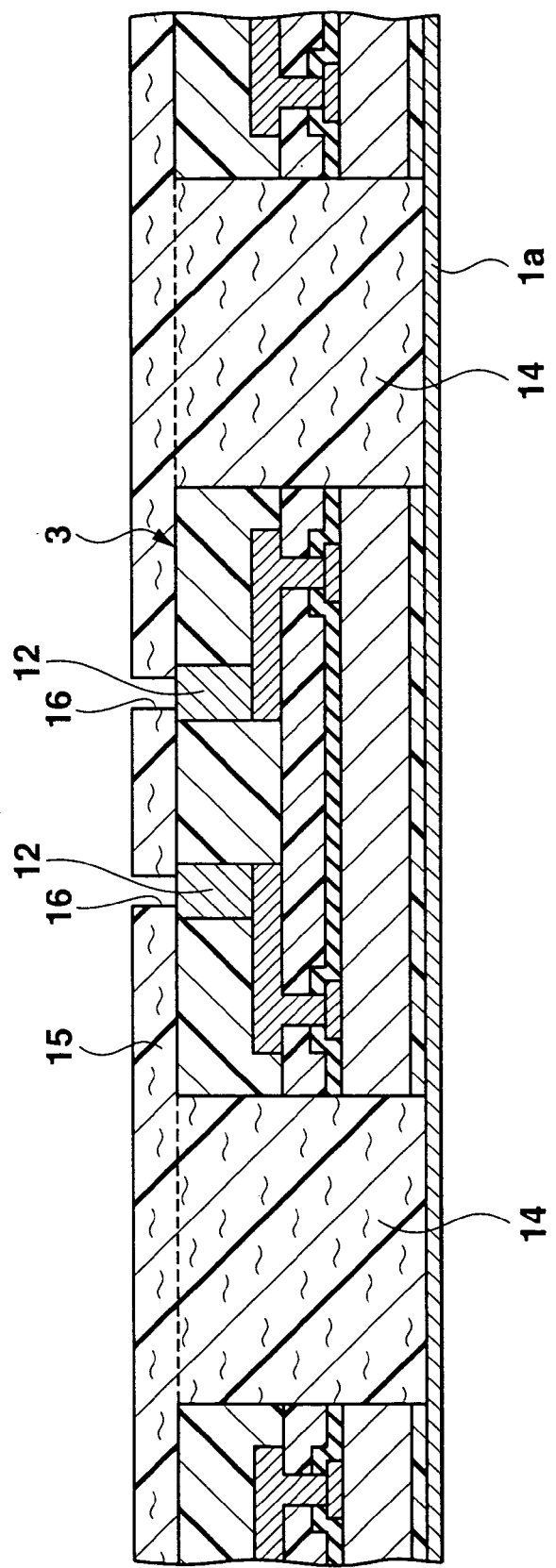
FIG. 12 is a sectional view showing a manufacturing step following FIG. 11.

Next, as shown in FIG. 12, opening portions 16 are formed in the second insulating material 15 at positions corresponding to the central portions of the upper surfaces of the columnar electrodes 12 by laser machining for irradiating the second insulating material 15 with a laser beam. Then, epoxy smears generated in the opening portions 16 are removed by a desmearing process, as needed.

Figure 13:
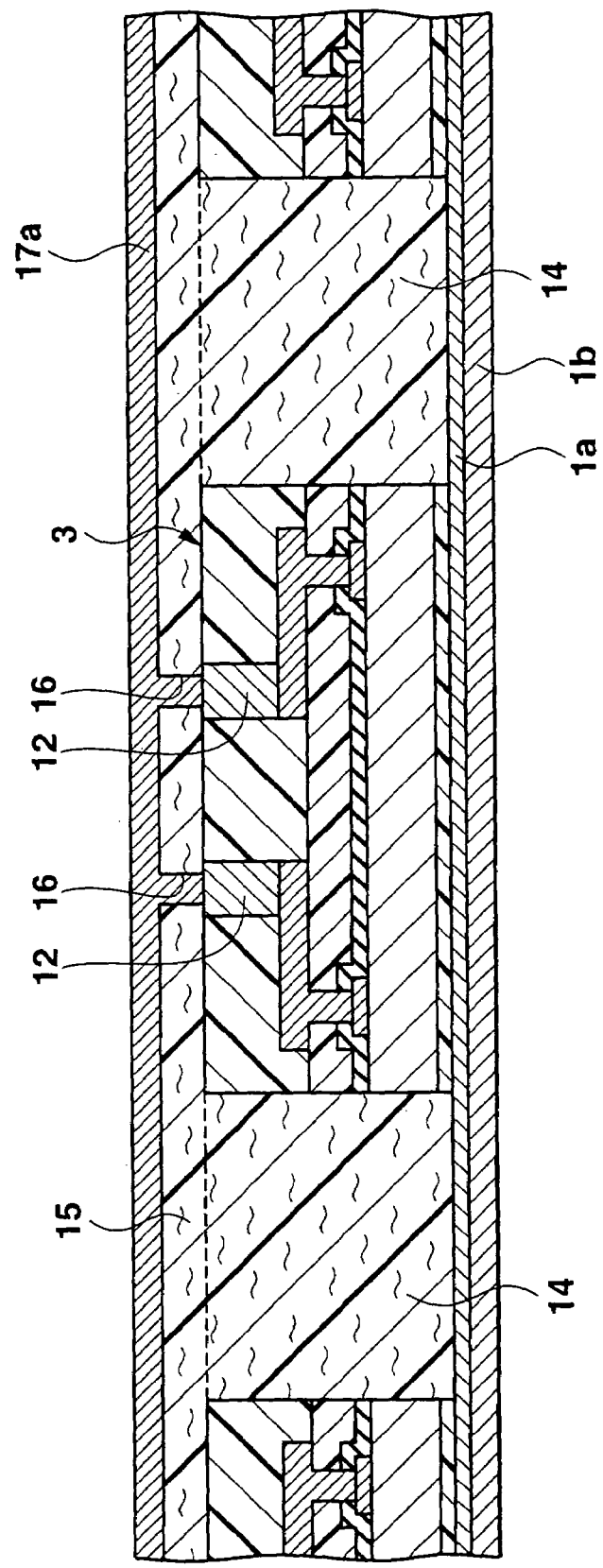
FIG. 13 is a sectional view showing a manufacturing step following FIG. 12.

As shown in FIG. 13, an upper interconnection formation layer 17*a* is formed on the entire upper surface of the second insulating material 15, including the upper surfaces of the columnar electrodes 12 exposed through the opening portions 16. Simultaneously, a metal film 1*b* is formed on the lower surface of the copper foil 1*a*. In this case, each of the upper interconnection formation layer 17*a* and metal film 1*b* includes a lower metal layer formed from, e.g., a copper layer made by electroless plating and an upper metal layer formed on the surface of the lower metal layer by executing copper electroplating using the lower metal layer as a plating current path.

Figure 14:
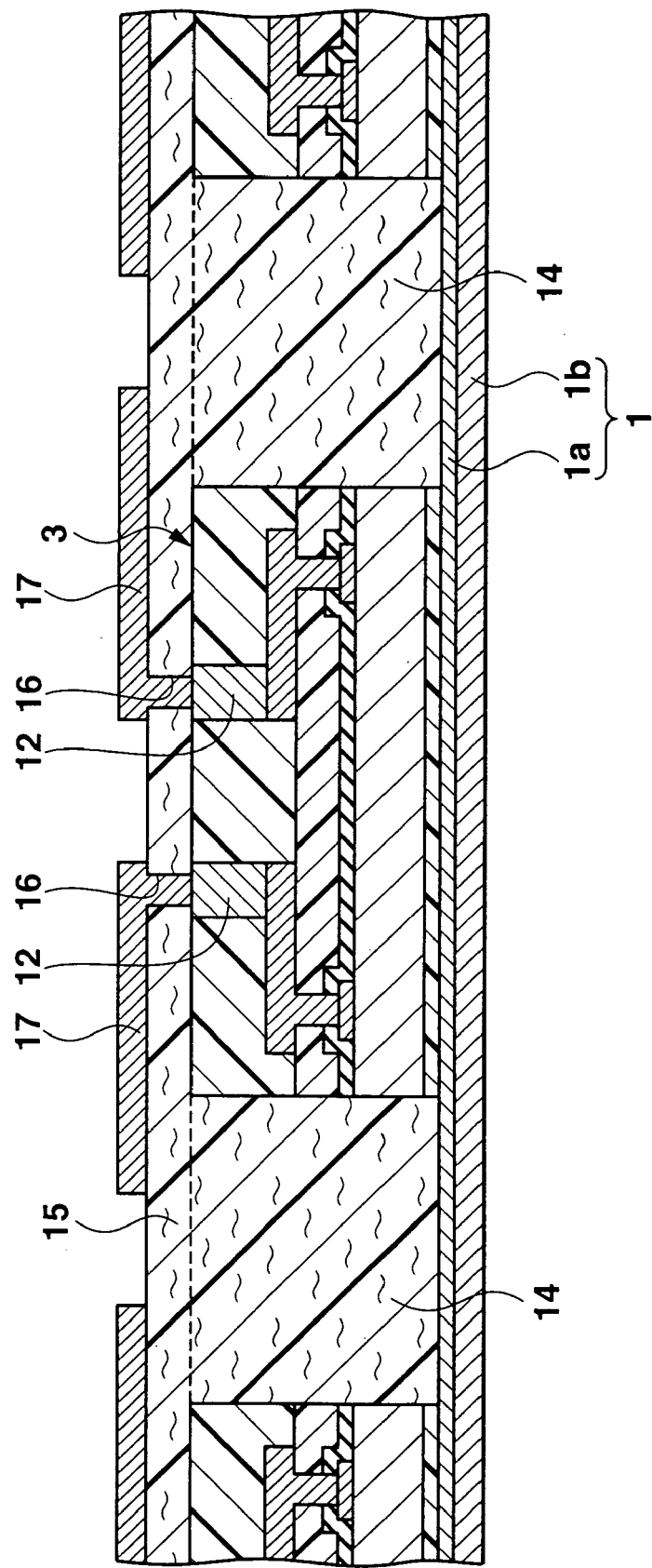
FIG. 14 is a sectional view showing a manufacturing step following FIG. 13.

When the upper interconnection formation layer 17*a* is patterned by photolithography, upper interconnections 17 are formed at predetermined positions of the upper surface of the second insulating material 15, as shown in FIG. 14. In this state, the upper interconnections 17 are connected to the upper surfaces of the columnar electrodes 12 through the opening portions 16 of the second insulating material 15. The copper foil 1*a* and metal film 1*b* formed on its lower surface form the metal layer 1.

Figure 15:
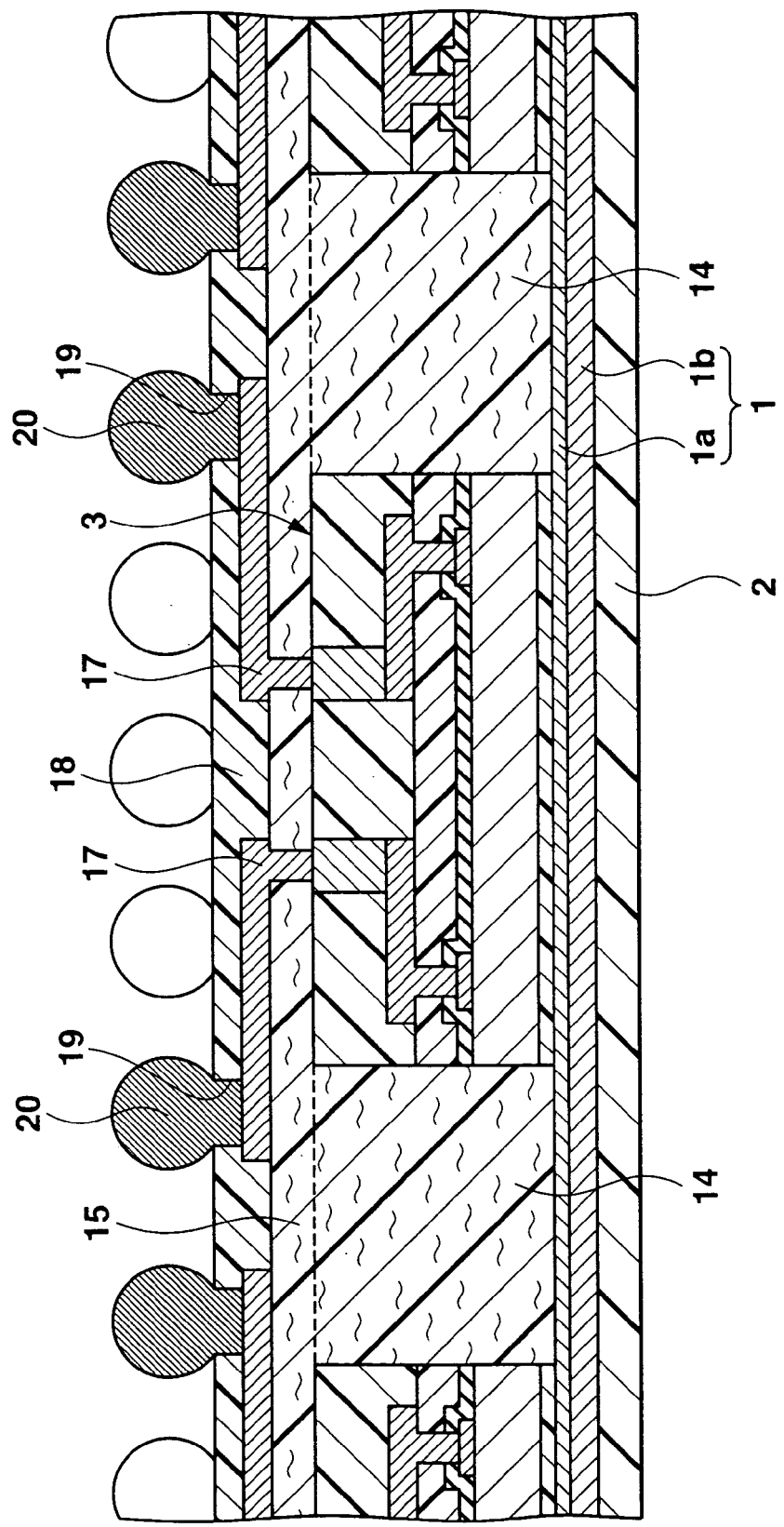
FIG. 15 is a sectional view showing a manufacturing step following FIG. 14.

As shown in FIG. 15, an upper insulating film 18 made of a solder resist is formed on the entire upper surface of the second insulating material 15 including the upper interconnections 17 by screen printing or spin coating. In this case, the upper insulating film 18 has opening portions 19 at positions corresponding to the connection pad portions of the upper interconnections 17. In addition, an insulating layer 2 made of a solder resist is formed on the lower surface of the metal layer 1 by spin coating. Next, projecting electrodes 20 are formed in and on the opening portions 19 and connected to the connection pad portions of the upper interconnections 17.

Figure 16:
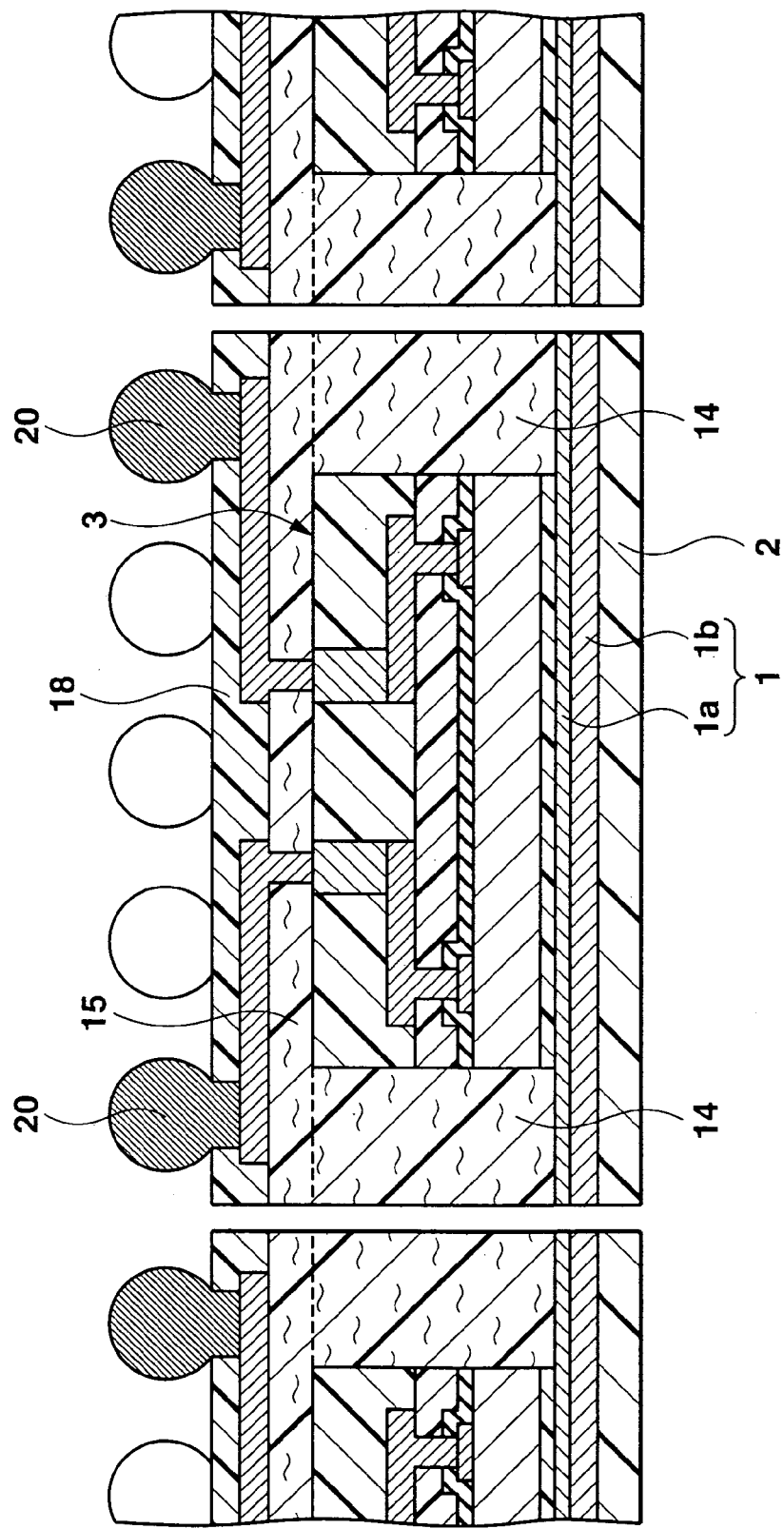
FIG. 16 is a sectional view showing a manufacturing step following FIG. 15.

As shown in FIG. 16, when the upper insulating film 18, first and second insulating materials 14 and 15, metal layer 1, and insulating layer 2 are cut between the adjacent semiconductor structures 3, a plurality of semiconductor devices shown in FIG. 1 are obtained.

In the semiconductor device thus obtained, the upper interconnections 17 to be connected to the columnar electrodes 12 of the semiconductor structure 3 are formed by electroless plating (or sputtering) and electroplating. For this reason, conductive connection between each upper interconnection 17 and a corresponding columnar electrode 12 of the semiconductor structure 3 can reliably be ensured.

In the above manufacturing method, the plurality of semiconductor structures 3 are arranged on the copper foil 1*a* via the adhesive layer 4. The first and second insulating materials 14 and 15, upper interconnections 17, upper insulating film 18, and projecting electrodes 20 are formed at once for the plurality of semiconductor structures 3. After that, the semiconductor structures are separated to obtain a plurality of semiconductor devices. Hence, the manufacturing step can be simplified. In addition, from the manufacturing step shown in FIG. 12, the plurality of semiconductor structures 3 can be transported together with the copper foil 1a. This also simplifies the manufacturing step.

In the above manufacturing method, as shown in FIG. 10, the semiconductor structure 3 of CSP type, which has the interconnections 11 and columnar electrodes 12, is bonded to the copper foil 1a via the adhesive layer 4. The cost can be reduced as compared to a case wherein, e.g., a normal semiconductor chip having connection pads 6 and insulating film 7 on a silicon substrate 5 is bonded to a copper foil 1a, and interconnections and columnar electrodes are formed on a sealing film formed around the semiconductor chip.

For example, assume that the copper foil 1a before cutting has an almost circular shape having a predetermined size, like a silicon wafer. In this case, if interconnections and columnar electrodes are formed on a sealing film formed around a semiconductor chip bonded to the copper foil 1a, the process area increases. In other words, since a low-density process is executed, the number of processed wafers per cycle decreases. This decreases the throughput and increases the cost.

To the contrary, in the manufacturing method described above, the semiconductor structure 3 of CSP type, which has the interconnections 11 and columnar electrodes 12, is bonded to the copper foil 1a via the adhesive layer 4, and then, building-up is executed. Although the number of processes increases, the efficiency becomes high because a high-density process is executed until formation of the columnar electrodes 12. For this reason, the total cost can be decreased even in consideration of the increase in number of processes.

In the above-described embodiment, the projecting electrodes 20 are arrayed in a matrix in correspondence with the entire surfaces of the semiconductor structures 3 and first insulating material 14 around it. However, the projecting electrodes 20 may be arranged only on a region corresponding to the first insulating material 14 around the semiconductor structure 3. The projecting electrodes 20 may be formed not totally around the semiconductor structure 3 but on only one to three sides of the four sides of the semiconductor structure 3. In this case, the first insulating material 14 need not have a rectangular frame shape and may be arranged on only a side where the projecting electrodes 20 are to be formed.

(Second Embodiment)

Figure 17:
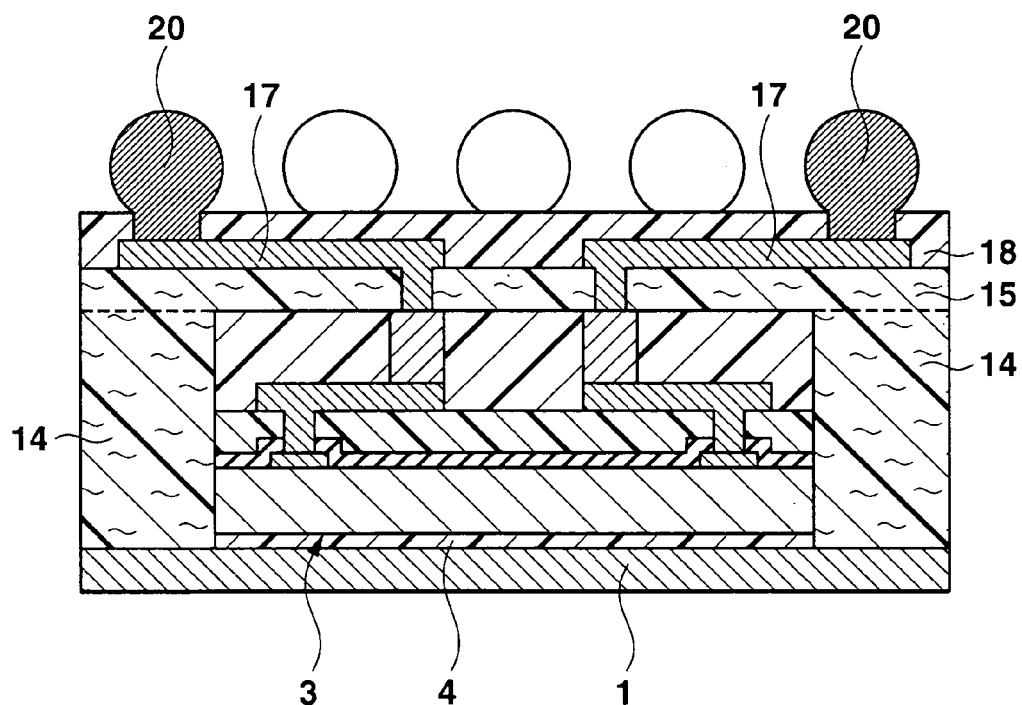
FIG. 17 is a sectional view of a semiconductor device according to the second embodiment of the present invention.

FIG. 17 is a sectional view of a semiconductor device according to the second embodiment of the present invention. This semiconductor device is different from that shown in FIG. 1 in that it has no insulating layer 2.

In manufacturing the semiconductor device according to the second embodiment, in the manufacturing step shown in FIG. 15, no insulating layer 2 is formed on the lower surface of a metal layer 1. After projecting electrodes 20 are formed, an upper insulating film 18, first and second insulating materials 14 and 15, and the metal layer 1 are cut between adjacent semiconductor structures 3. Accordingly, a plurality of semiconductor devices shown in FIG. 17 are obtained. The semiconductor device thus obtained can be thin because it has no insulating layer 2.

(Third Embodiment)

Figure 18:
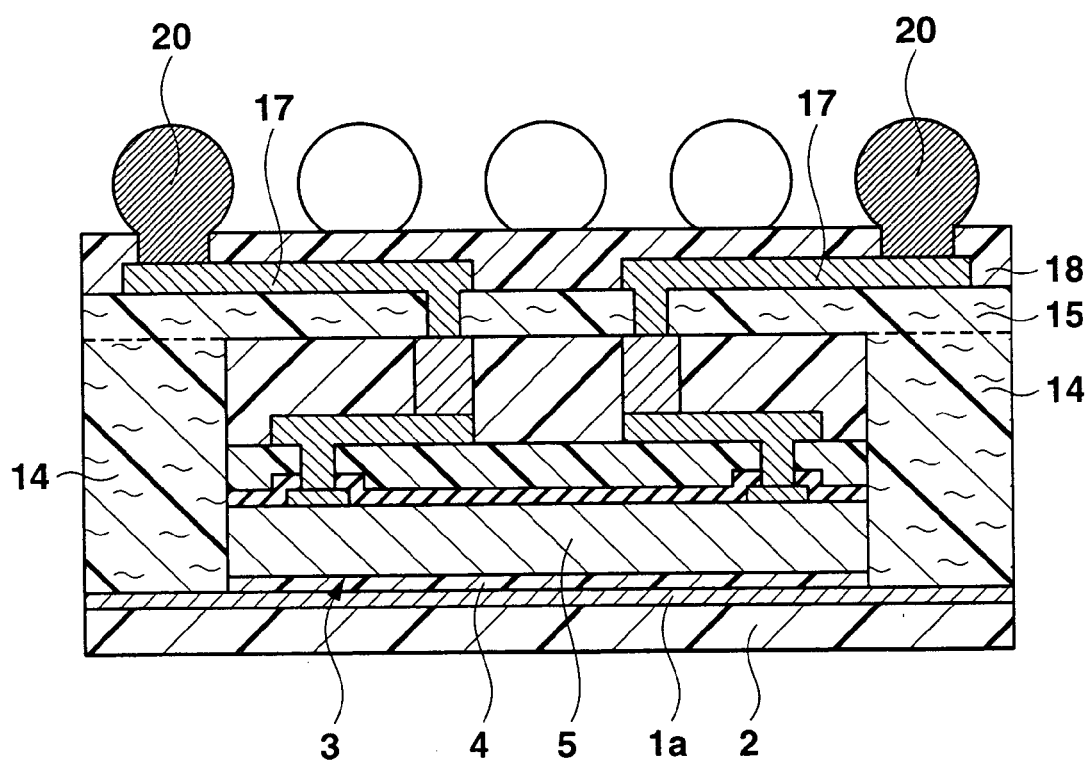
FIG. 18 is a sectional view of a semiconductor device according to the third embodiment of the present invention.

FIG. 18 is a sectional view of a semiconductor device according to the third embodiment of the present invention. This semiconductor device can be obtained by omitting formation of a metal layer 1b on the lower surface of a copper foil 1a in the manufacturing step shown in FIG. 13 and forming an insulating layer 2 in the manufacturing step shown in FIG. 15.

(Fourth Embodiment)

Figure 19:
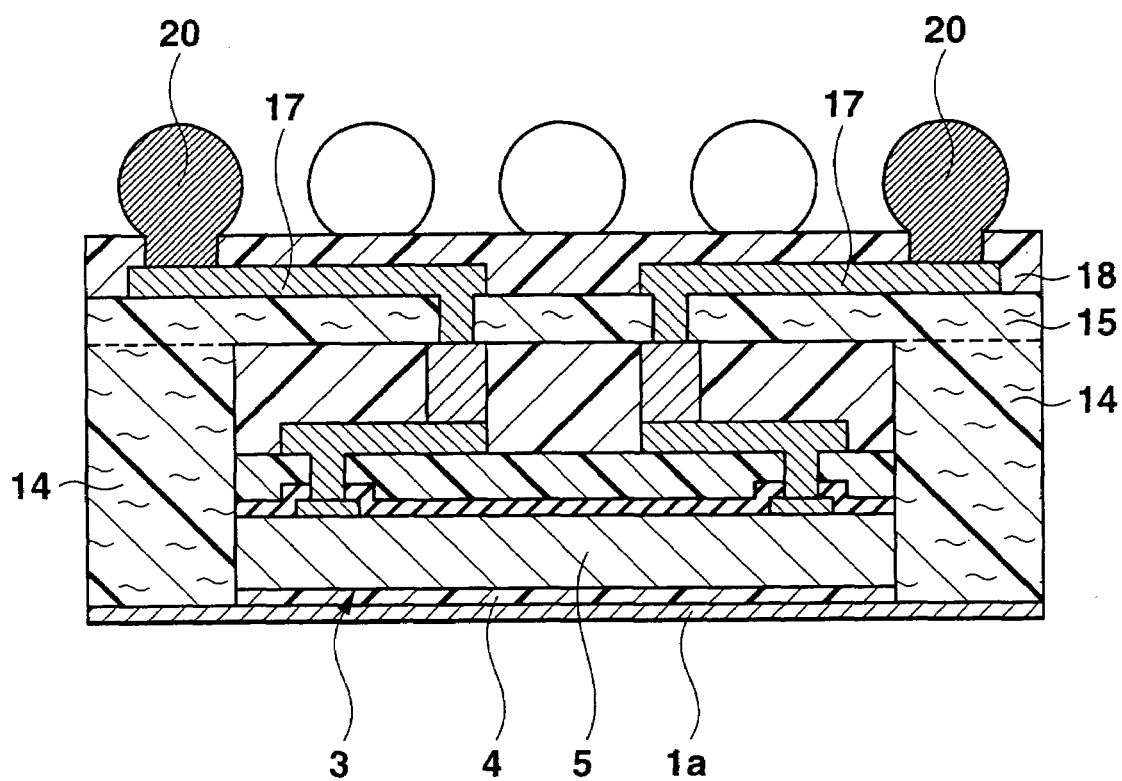
FIG. 19 is a sectional view of a semiconductor device according to the fourth embodiment of the present invention.

FIG. 19 is a sectional view of a semiconductor device according to the fourth embodiment of the present invention. This semiconductor device can be obtained by omitting formation of a metal layer 1b on the lower surface of a copper foil 1a in the manufacturing step shown in FIG. 13 and omitting formation of an insulating layer 2 in the manufacturing step shown in FIG. 15.

(Fifth Embodiment)

Figure 20:
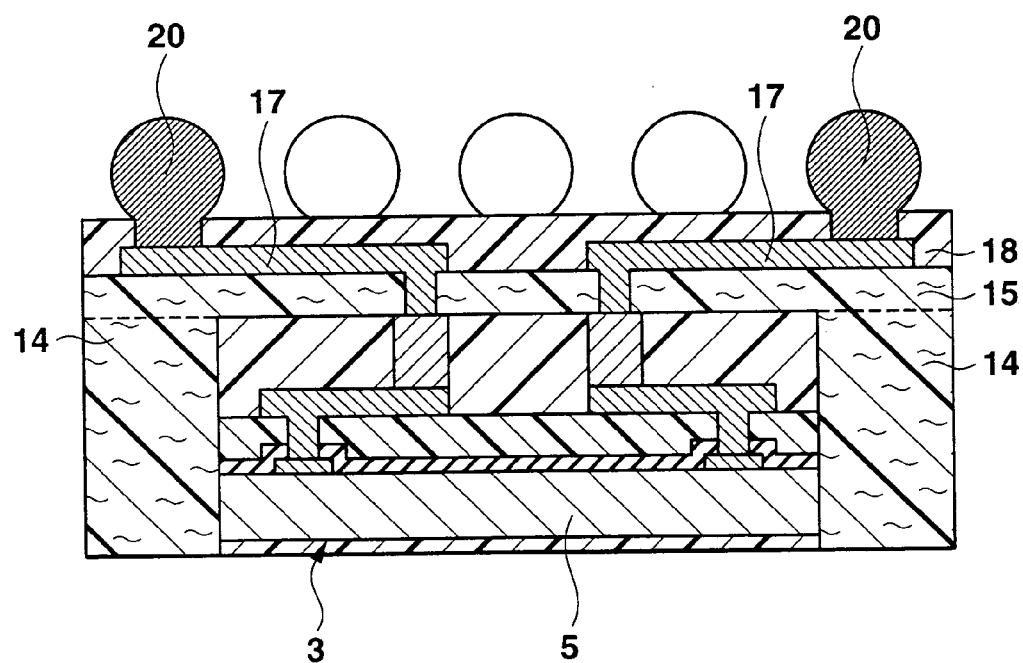
FIG. 20 is a sectional view of a semiconductor device according to the fifth embodiment of the present invention.

FIG. 20 is a sectional view of a semiconductor device according to the fifth embodiment of the present invention. This semiconductor device is different from that shown in FIG. 1 in that it has neither a metal layer 1 nor an insulating layer 2.

In manufacturing the semiconductor device according to the fifth embodiment, for example, in the manufacturing step shown in FIG. 15, formation of the insulating layer 2 on the lower surface of the metal layer 1 is omitted. After projecting electrodes 20 are formed, the metal layer 1 is removed by polishing or etching. Next, an upper insulating film 18 and first and second insulating materials 14 and 15 are cut between adjacent semiconductor structures 3. Accordingly, a plurality of semiconductor devices shown in FIG. 20 are obtained. The semiconductor device thus obtained can be thinner because it has neither a metal layer 1 nor an insulating layer 2.

(Sixth Embodiment)

Figure 21:
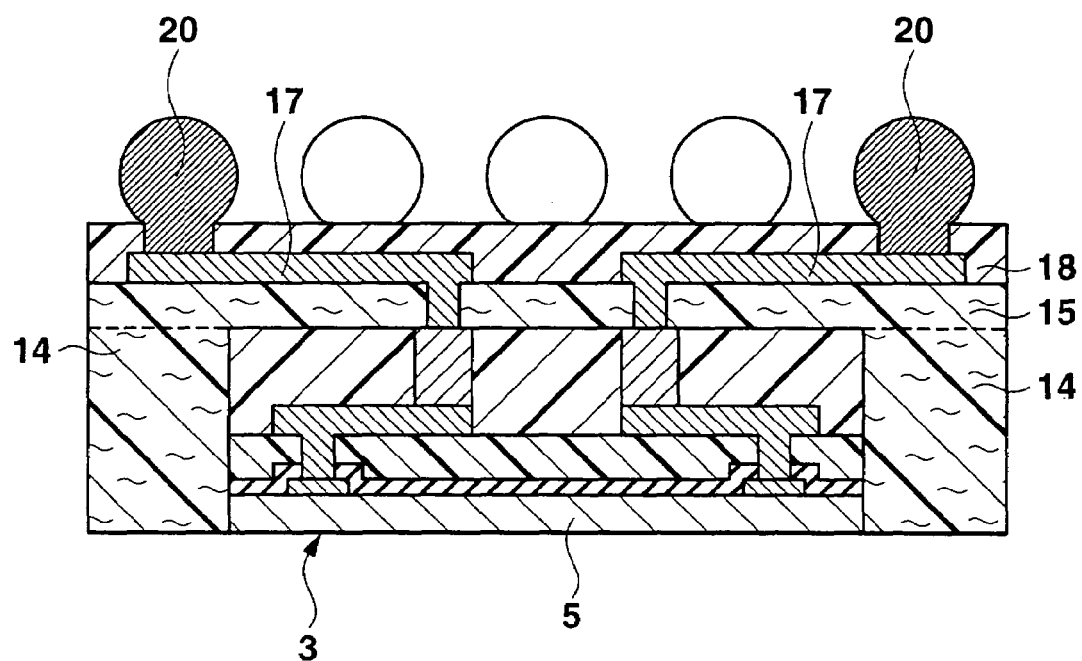
FIG. 21 is a sectional view of a semiconductor device according to the sixth embodiment of the present invention.

FIG. 21 is a sectional view of a semiconductor device according to the sixth embodiment of the present invention. This semiconductor device can be obtained in the following manner. For example, in the state shown in FIG. 19, a metal layer 1 is removed by polishing or etching. Then, the lower surface side of a silicon substrate 5 including an adhesive layer 4 and the lower surface side of a first insulating material 14 are appropriately polished. Next, an upper insulating film 18 and first and second insulating materials 14 and 15 are cut between adjacent semiconductor structures 3 to obtain the semiconductor device. The semiconductor device thus obtained can be further thinner.

Alternatively, before formation of projecting electrodes 20, the metal layer 1 is removed by polishing or etching (and the lower surface side of the silicon substrate 5 including the adhesive layer 4 and the lower surface side of the first insulating material 14 are appropriately polished, as needed). Then, projecting electrodes 20 are formed, and the upper insulating film 18 and first and second insulating materials 14 and 15 are cut between adjacent semiconductor structures 3.

(Seventh Embodiment)

Figure 22:
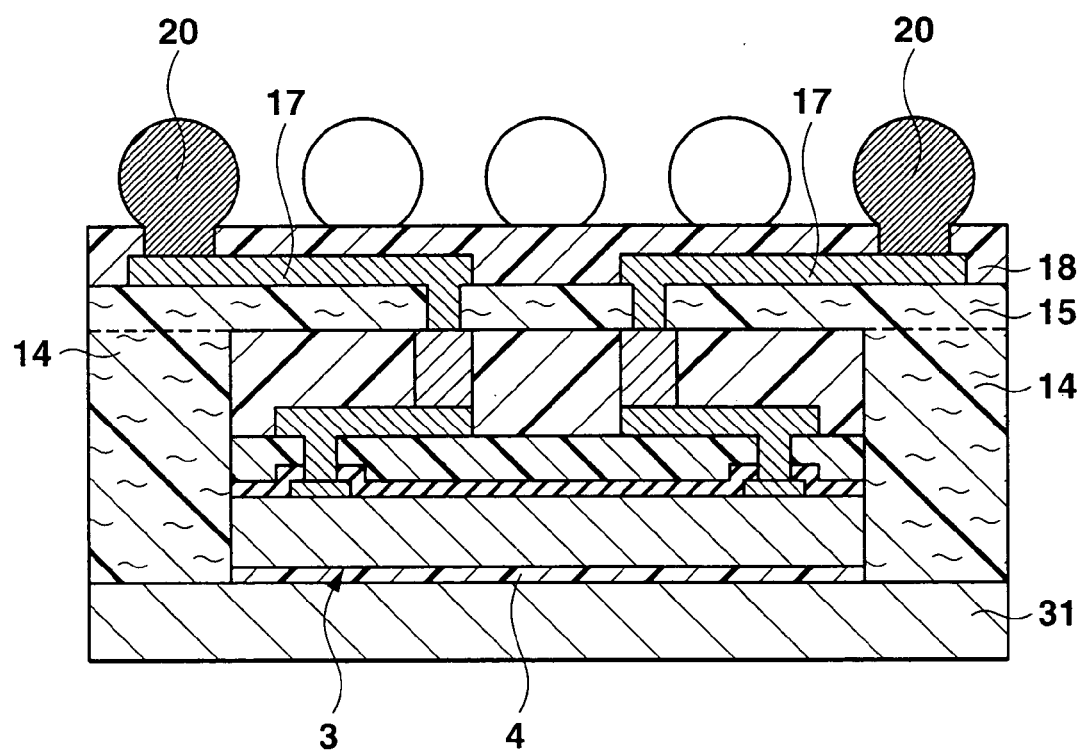
FIG. 22 is a sectional view of a semiconductor device according to the seventh embodiment of the present invention.

FIG. 22 is a sectional view of a semiconductor device according to the seventh embodiment of the present invention. This semiconductor device is different from that shown in FIG. 1 in that it has neither a metal layer 1 nor an insulating layer 2 but a base plate 31 in place of them.

In manufacturing the semiconductor device according to the seventh embodiment, in the manufacturing step shown in FIG. 10, formation of an adhesive layer 32 and copper foil 1a on the upper surface of the base plate 31 is omitted. Semiconductor structures 3 are bonded to the upper surface of the base plate 31 via an adhesive layer 4 formed on its lower surface. Nothing is formed on the lower surface of the base plate 31. After projecting electrodes 20 are formed, an upper insulating film 18, first and second insulating materials 14 and 15, and the base plate 31 are cut between adjacent semiconductor structures 3. Accordingly, a plurality of semiconductor devices shown in FIG. 22 are obtained.

(Eighth Embodiment)

Figure 23:
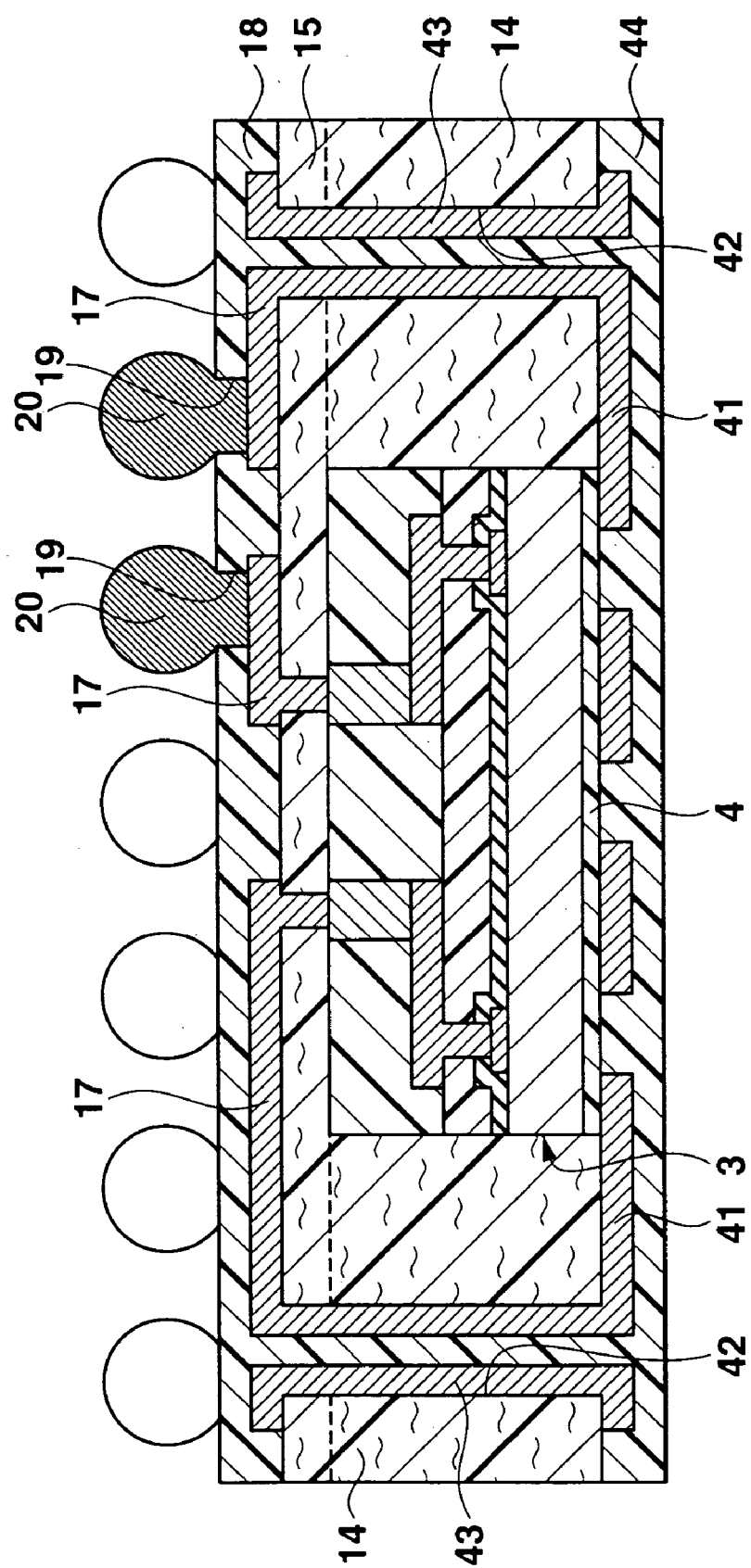
FIG. 23 is a sectional view of a semiconductor device according to the eighth embodiment of the present invention.

FIG. 23 is a sectional view of a semiconductor device according to the eighth embodiment of the present invention. This semiconductor device is largely different from that shown in FIG. 1 in that lower interconnections 41 are formed on the lower surfaces of an adhesive layer 4 and first insulating material 14 and connected to upper interconnections 17 through vertical electrical connection portions 43 which are formed on the inner surfaces of through holes 42 formed at predetermined positions of the first and second insulating materials 14 and 15 arranged around a semiconductor structure 3.

Figure 24:
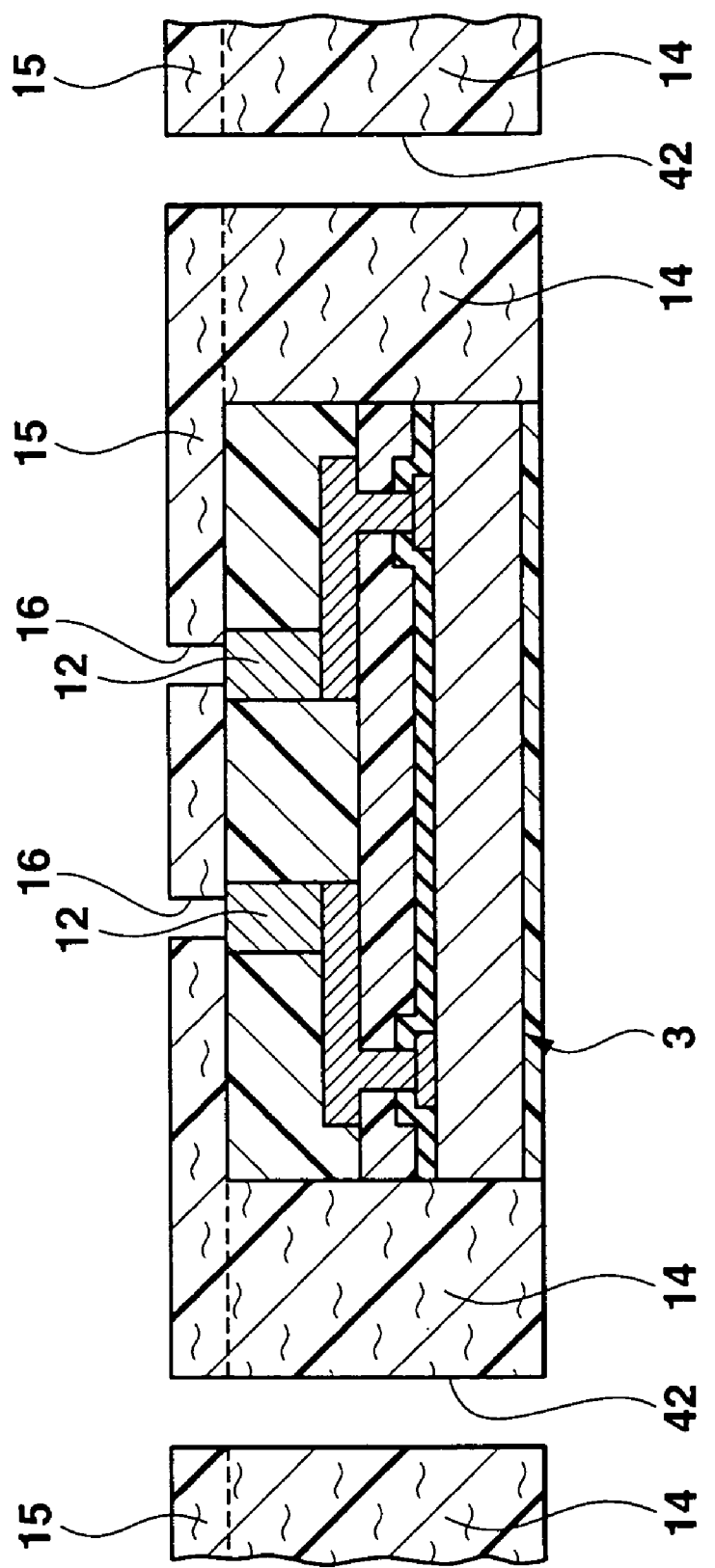
FIG. 24 is a sectional view showing a predetermined manufacturing step in an example of a method of manufacturing the semiconductor device shown in FIG. 23.

In manufacturing the semiconductor device according to the eighth embodiment, for example, after the manufacturing step shown in FIG. 11, a base plate 31, adhesive layer 32, and copper foil 1a are removed by polishing or etching. Next, as shown in FIG. 24, opening portions 16 are formed in the second insulating material 15 at positions corresponding to the central portions of the upper surfaces of columnar electrodes 12 by laser machining. In addition, through holes 42 are formed at predetermined positions of the first and second insulating materials 14 and 15 arranged around the semiconductor structures 3.

Figure 25:
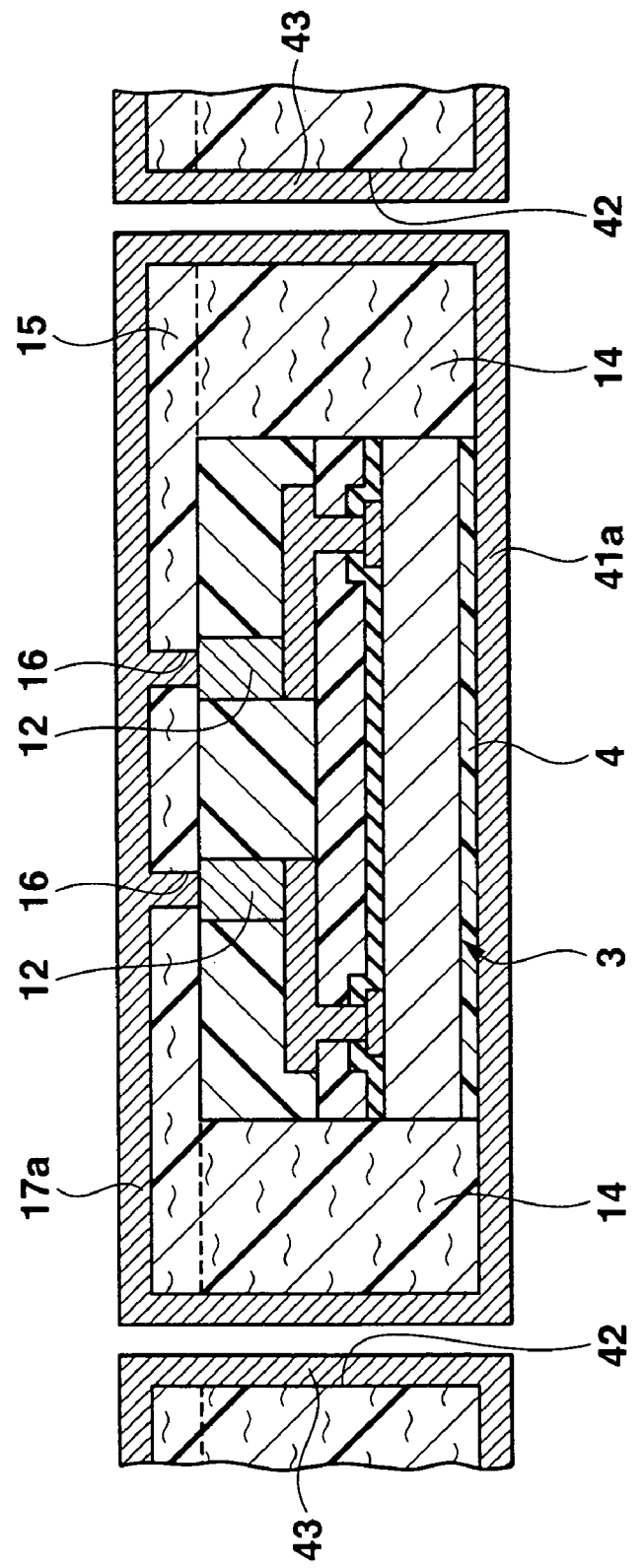
FIG. 25 is a sectional view showing a manufacturing step following FIG. 24.

As shown in FIG. 25, copper electroless plating and copper electroplating are continuously executed to form an upper interconnection formation layer 17a on the entire upper surface of the second insulating material 15 including the upper surfaces of the columnar electrodes 12 exposed through the opening portions 16. In addition, a lower interconnection formation layer 41a is formed on the entire lower surface of the adhesive layer and first insulating material 14. Then, vertical electrical connection portions 43 are formed on the inner surfaces of the through holes 42.

Next, the upper interconnection formation layer 17a and lower interconnection formation layer 41a are patterned by photolithography. For example, as shown in FIG. 23, the upper interconnections 17 are formed on the upper surface of the second insulating material 15, the lower interconnections 41 are formed on the lower surfaces of the adhesive layer 4 and first insulating material 14, and the vertical electrical connection portion 43 are left on the inner surfaces of the through holes 42.

A description will be done next with reference to FIG. 23. An upper insulating film 18 made of a solder resist and having opening portions 19 is formed on the upper surface of the second insulating material 15 including the upper interconnections 17. In addition, a lower insulating film 44 made of a solder resist is formed on the entire lower surface of the first insulating material 14 including the lower interconnections 41. In this case, the vertical electrical connection portions 43 are filled with the solder resist. Next, projecting electrodes 20 are formed, and the upper insulating film 18, first and second insulating materials 14 and 15, and lower insulating film 44 are cut between adjacent semiconductor structures 3. Accordingly, a plurality of semiconductor devices shown in FIG. 23 are obtained.

(Ninth Embodiment)

Figure 26:
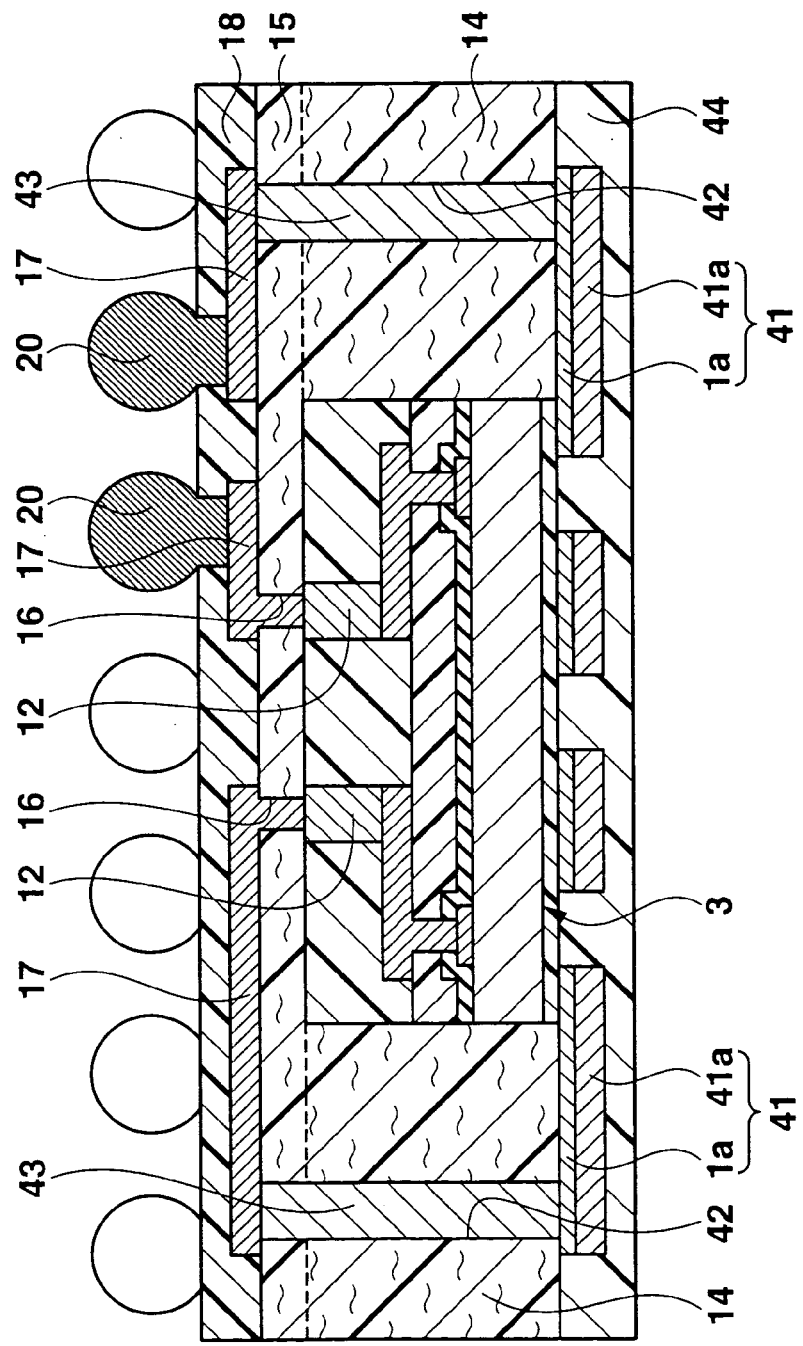
FIG. 26 is a sectional view of a semiconductor device according to the ninth embodiment of the present invention.

FIG. 26 is a sectional view of a semiconductor device according to the ninth embodiment of the present invention. This semiconductor device is largely different from that shown in FIG. 23 in that lower interconnections 41 are formed from a copper foil 1a and a copper layer 41a formed on the lower surface of the copper foil 1a, and vertical electrical connection portions 43 are formed in through holes 42 without forming any gaps.

Figure 27:
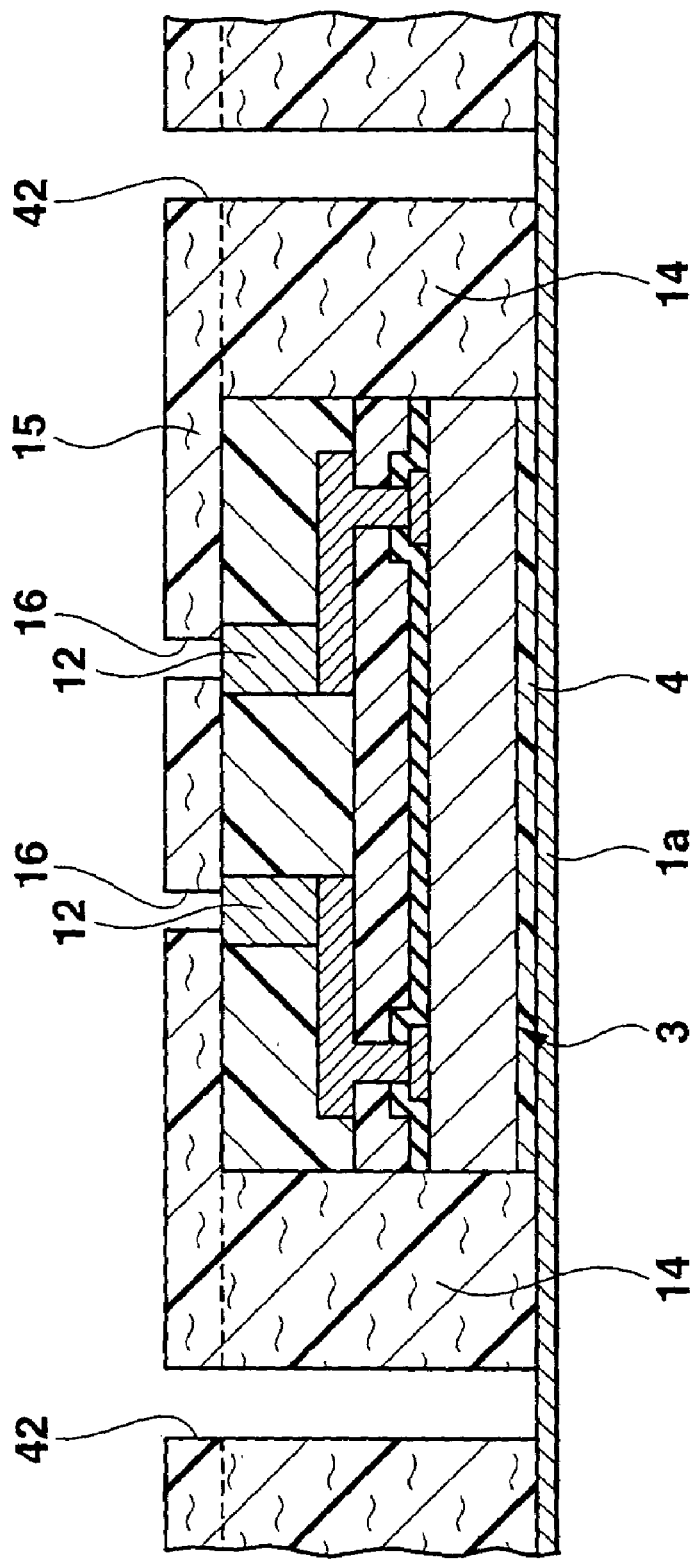
FIG. 27 is a sectional view showing a predetermined manufacturing step in an example of a method of manufacturing the semiconductor device shown in FIG. 26.

In manufacturing the semiconductor device according to the ninth embodiment, for example, in the manufacturing step shown in FIG. 12, opening portions 16 are formed in a second insulating material 15 at positions corresponding to the central portions of the upper surfaces of columnar electrodes 12 by laser machining, as shown in FIG. 27. In addition, through holes 42 are formed at predetermined positions of first and second insulating materials 14 and 15 arranged around semiconductor structures 3. In this case, the copper foil 1a is formed on the entire lower surface of an adhesive layer 4 and the first insulating material 14. Hence, the lower surface side of the through holes 42 is covered with the copper foil 1a.

Figure 28:
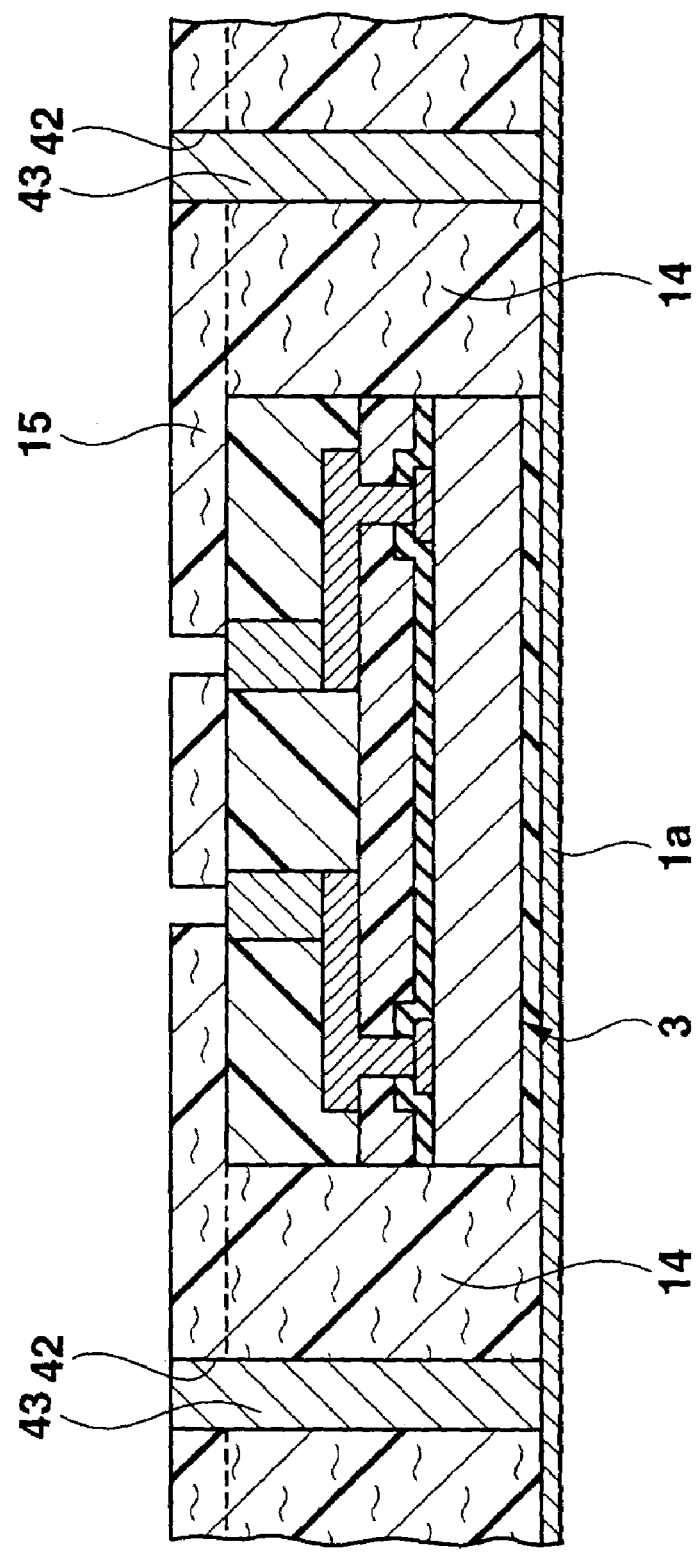
FIG. 28 is a sectional view showing a manufacturing step following FIG. 27.

As shown in FIG. 28, copper electroplating is executed using the copper foil 1a as a plating current path to form the vertical electrical connection portions 43 on the upper surface of the copper foil 1a in the through holes 42. In this case, the upper surface of the vertical electrical connection portion 43 is preferably almost flush with the upper plane of the through hole 42 or located at a slightly lower position.

Figure 29:
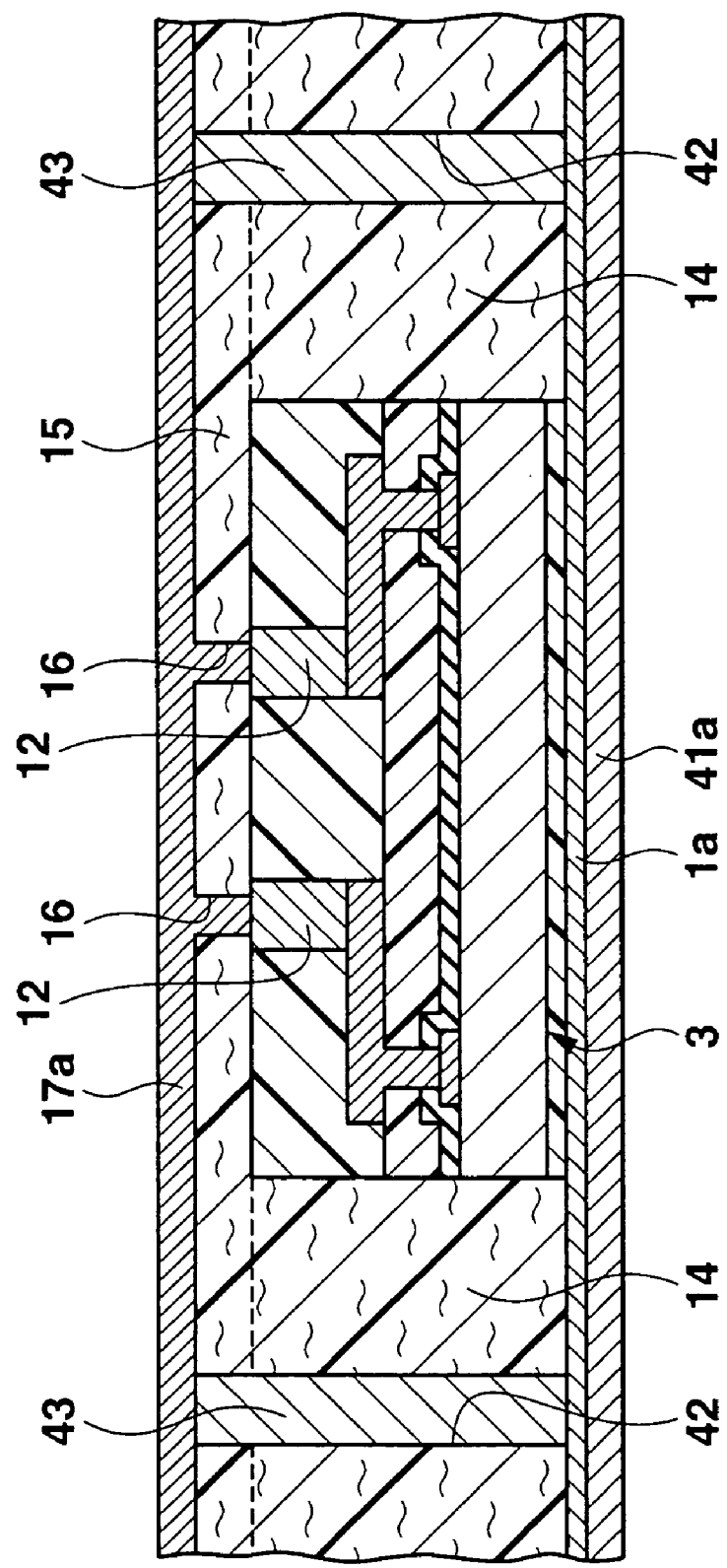
FIG. 29 is a sectional view showing a manufacturing step following FIG. 28.

Next, as shown in FIG. 29, copper electroless plating and copper electroplating are continuously executed to form an upper interconnection formation layer 17a on the entire upper surface of the second insulating material 15 including the upper surfaces of the columnar electrodes 12 exposed through the opening portions 16 and the upper surfaces of the vertical electrical connection portions 43 in the through holes 42. In addition, the lower interconnection formation layer 41a is formed on the entire lower surface of the copper foil 1a. Then, with the same manufacturing step as in the eighth embodiment, a plurality of semiconductor devices shown in FIG. 26 are obtained.

(10th Embodiment)

Figure 30:
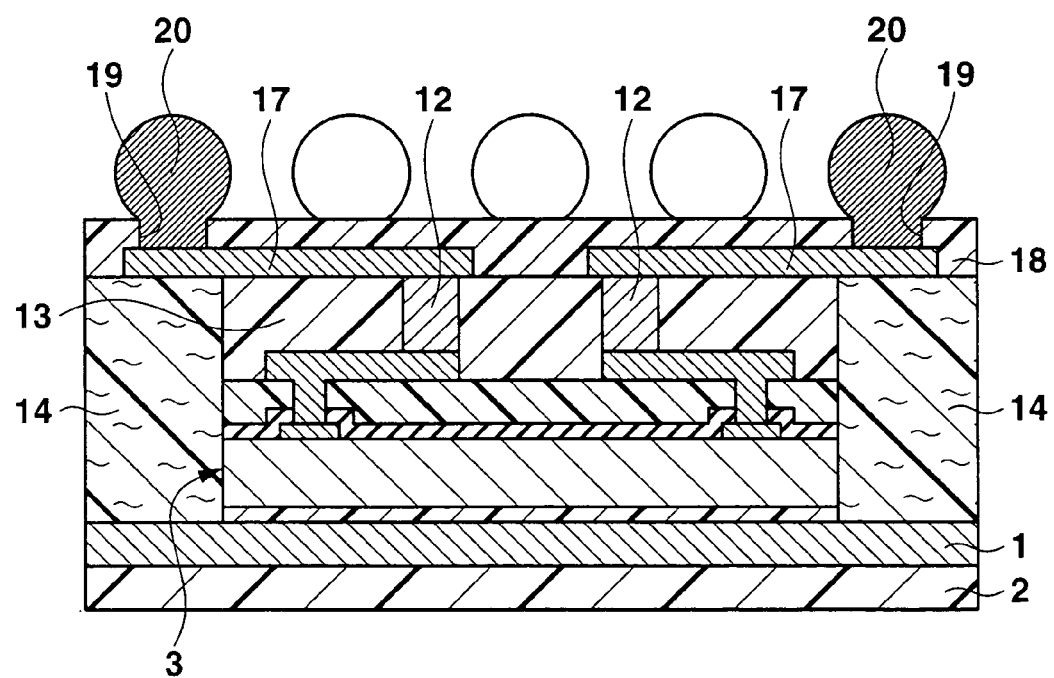
FIG. 30 is a sectional view of a semiconductor device according to the 10th embodiment of the present invention.

FIG. 30 is a sectional view of a semiconductor device according to the 10th embodiment of the present invention. This semiconductor device is different from that shown in FIG. 1 in that it has no second insulating material 15.

In manufacturing the semiconductor device according to the 10th embodiment, after the manufacturing step shown in FIG. 11, a base plate 31 and adhesive layer 32 are removed. In addition, the second insulating material 15 is removed by polishing. In this case, in removing the second insulating material 15 by polishing, if the upper surface side of a sealing film 13 including columnar electrodes 12 and semiconductor structures 3 and the upper surface side of a first insulating material 14 are slightly polished, no problem is posed.

The subsequent manufacturing step is the same as in the first embodiment. In the 10th embodiment, however, as shown in FIG. 30, upper interconnections 17 are formed on the upper surfaces of the semiconductor structures 3 and first insulating material 14 and connected to the upper surfaces of the columnar electrodes 12. An upper insulating film 18 having opening portions 19 is formed on the upper interconnections 17. Projecting electrodes 20 are formed in and on the opening portions 19 and connected to the connection pad portions of the upper interconnections 17. Although not illustrated, if the columnar electrodes 12 are arrayed in a matrix, the upper interconnection 17 are led between the columnar electrodes 12, as a matter of course.

(11th Embodiment)

Figure 31:
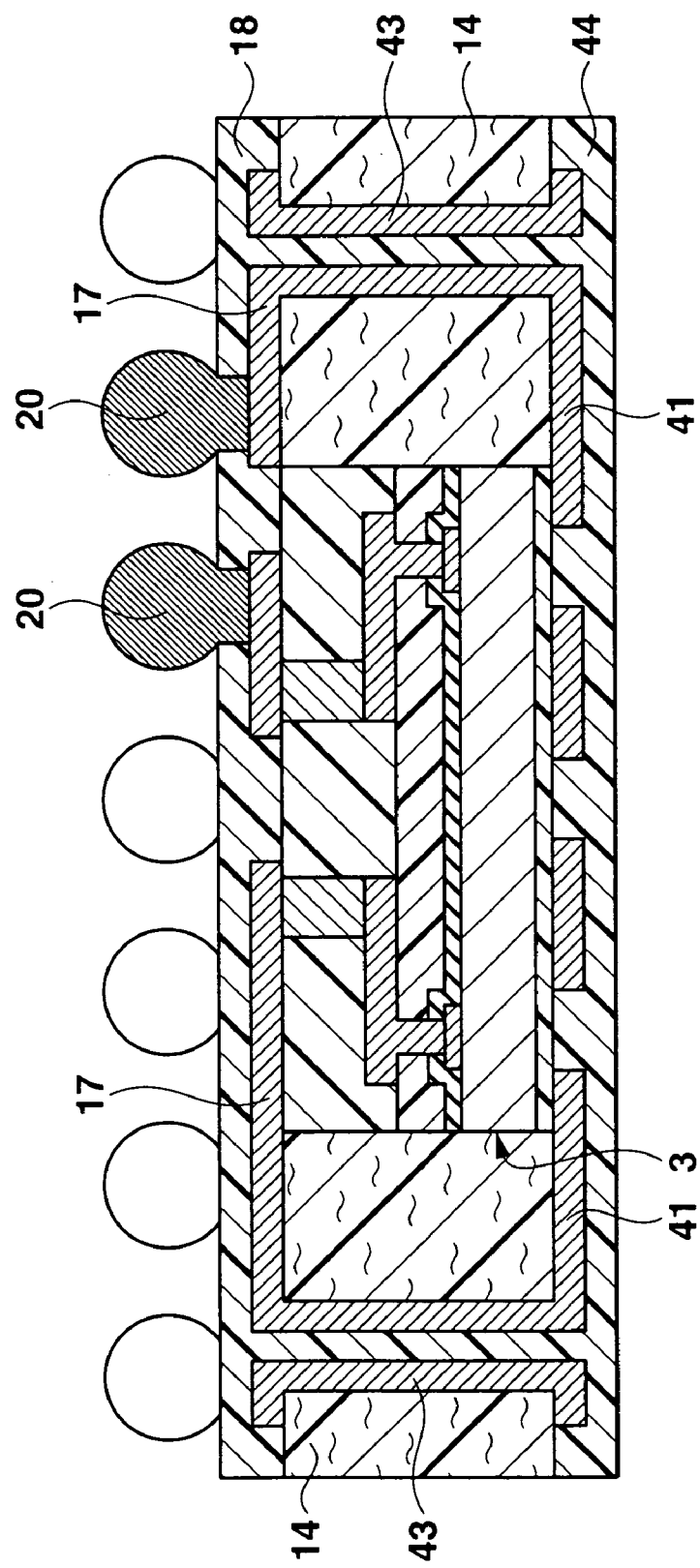
FIG. 31 is a sectional view of a semiconductor device according to the 11th embodiment of the present invention.

FIG. 31 is a sectional view of a semiconductor device according to the 11th embodiment of the present invention.

This semiconductor device is obtained by removing a second insulating material 15 by polishing in FIG. 23, as in the 10th embodiment.

(12th Embodiment)

Figure 32:
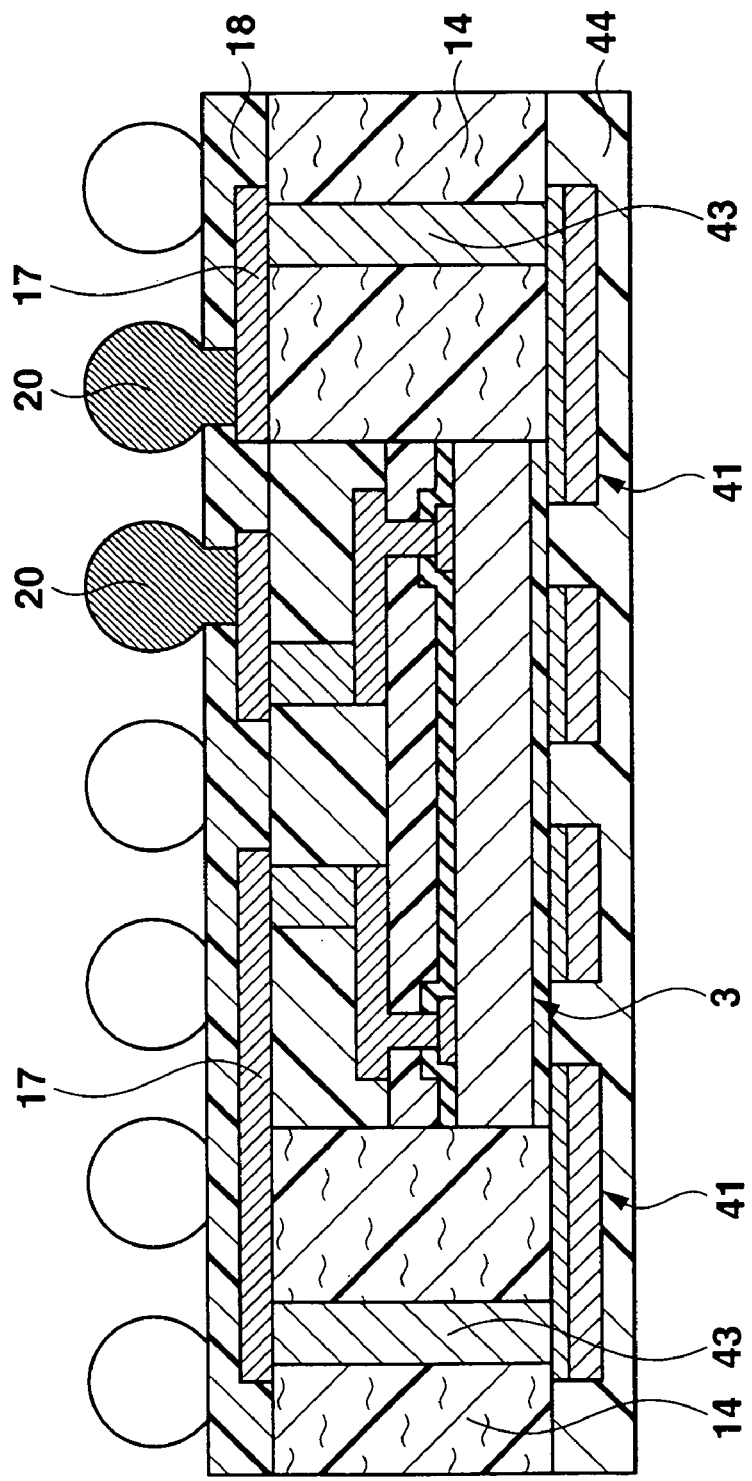
FIG. 32 is a sectional view of a semiconductor device according to the 12th embodiment of the present invention.

FIG. 32 is a sectional view of a semiconductor device according to the 12th embodiment of the present invention. This semiconductor device is obtained by removing a second insulating material 15 by polishing in FIG. 26, as in the 10th embodiment.

(13th Embodiment)

Figure 33:
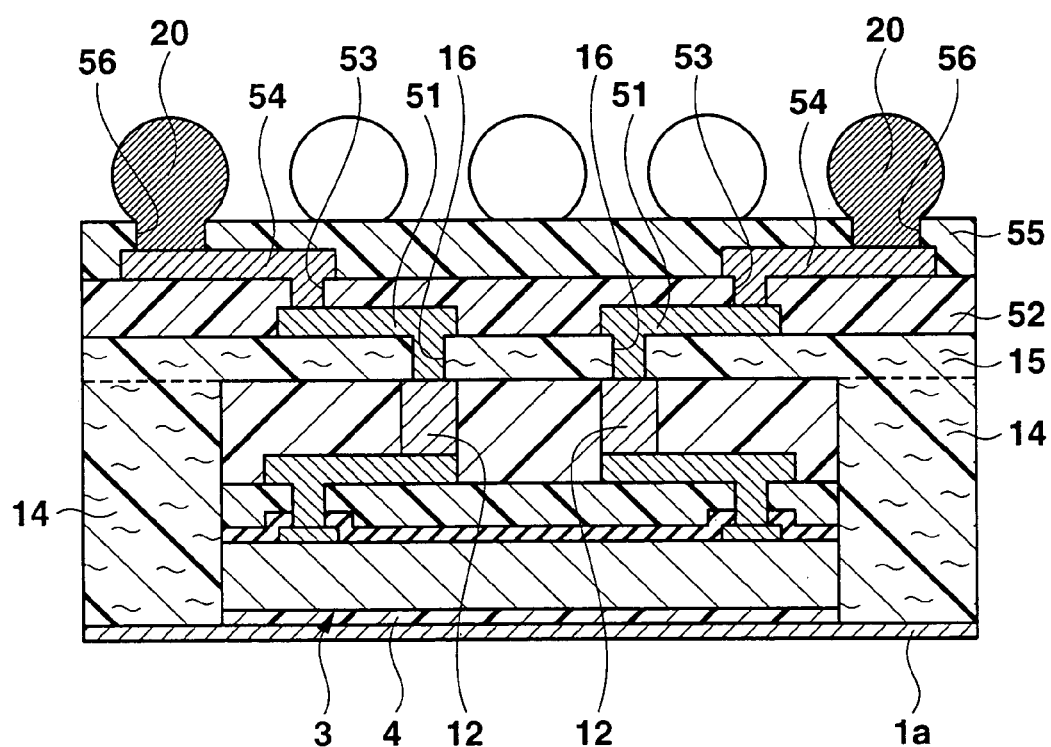
FIG. 33 is a sectional view of a semiconductor device according to the 13th embodiment of the present invention.

In the above-described embodiments, for example, as shown in FIG. 1, upper interconnections 17 and an upper insulating film 18, each of which includes one layer, are formed on a second insulating material 15. However, the present invention is not limited to this. The upper interconnections 17 and upper insulating film 18 each including two or more layers may be formed. For example, as in the 13th embodiment of the present invention shown in FIG. 33, each of the upper interconnections 17 and upper insulating film 18 may have two layers.

More specifically, in this semiconductor device, first upper interconnections 51 are formed on the upper surface of the second insulating material 15 and connected to the upper surfaces of columnar electrodes 12 through opening portions 16 formed in the second insulating material 15. A first upper insulating film 52 made of epoxy resin or polyimide resin is formed on the upper surface of the second insulating material 15 including the first upper interconnections 51. Second upper interconnections 54 are formed on the upper surface of the first upper insulating film 52 and connected to the upper surfaces of the connection pad portions of the first upper interconnections 51 through opening portions 53 formed in the first upper insulating film 52.

A second upper insulating film 55 made of a solder resist is formed on the upper surface of the first upper insulating film 52 including the second upper interconnections 54. The second upper insulating film 55 has opening portions 56 at positions corresponding to the connection pad portions of the second upper interconnections 54. Projecting electrodes 20 are formed in and on the opening portions 56 and connected to the connection pad portions of the second upper interconnections 54. In this case, only a copper foil 1a is formed on the lower surfaces of an adhesive layer 4 and first insulating material 14.

(14th Embodiment)

Figure 34:
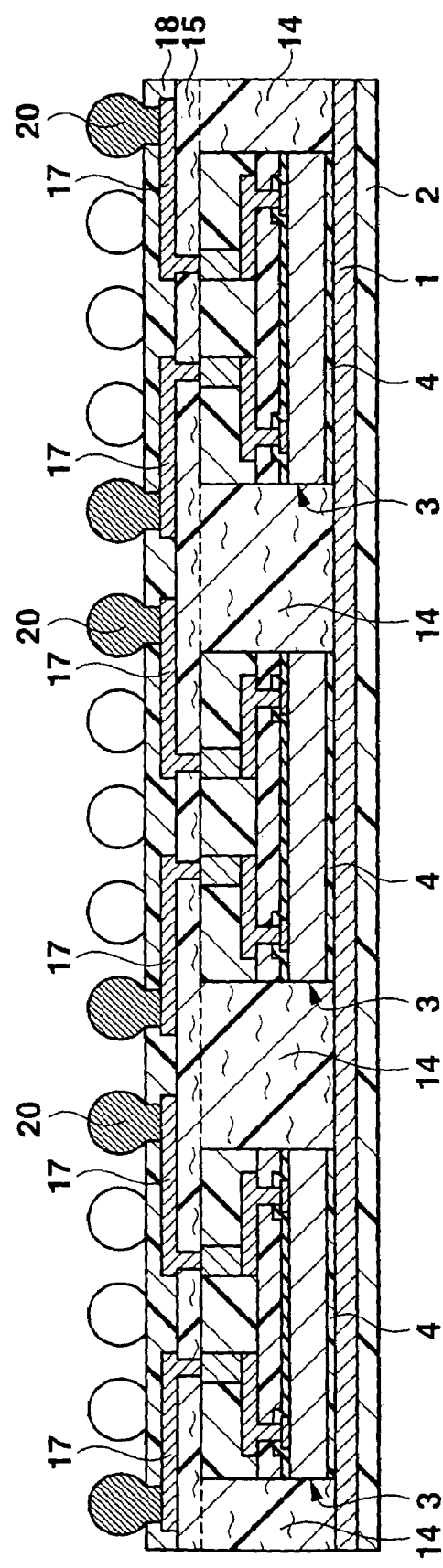
FIG. 34 is a sectional view of a semiconductor device according to the 14th embodiment of the present invention.

For example, in FIG. 16, the resultant structure is cut between the semiconductor structures 3 adjacent to each other. However, the present invention is not limited to this. The resultant structure may be cut for every two or more semiconductor structures 3. For example, as in the 14th embodiment of the present invention shown in FIG. 34, the resultant structure may be cut for every three semiconductor structures 3 to obtain a multi-chip module type semiconductor device. In this case, the three semiconductor structures 3 can be either of the same type or of different types.

In the above embodiment, the semiconductor structures 3 and a first insulating material 14 are formed in a state wherein the lower surfaces of the semiconductor structures 3 are supported by a base plate 31. After a second insulating material 15 is formed on the semiconductor structures 3 and first insulating material 14, the base plate 31 is removed. The base plate 31 does not remain in the finished semiconductor device. However, an organic material such as an epoxy-based material or polyimide-based material or a thin plate formed from a thin metal film may be used as the material of the base plate 31. After upper interconnections 17 and upper insulating film 18 are formed, and as needed, after projecting electrodes 20 are formed, the base plate 31 may be cut together with the upper insulating film 18, second insulating material 15, and first insulating material 14 to leave the base plate 31 as the base member of the semiconductor device. In this case, the base may be cut after interconnections and the like are formed on a surface of the base plate 31 on the opposite side of the mounting surface of the semiconductor structures 3.

In the above-described first to 14th embodiments, semiconductor devices are manufactured basically by forming insulating films and interconnections while supporting the lower surface of each semiconductor structure 3 by the base plate 31.

However, the semiconductor devices may be manufactured by forming insulating films and interconnections while supporting the upper surface of each semiconductor structure 3 by the base plate 31. This method will be described below in detail.

(15th Embodiment)

Figure 35:
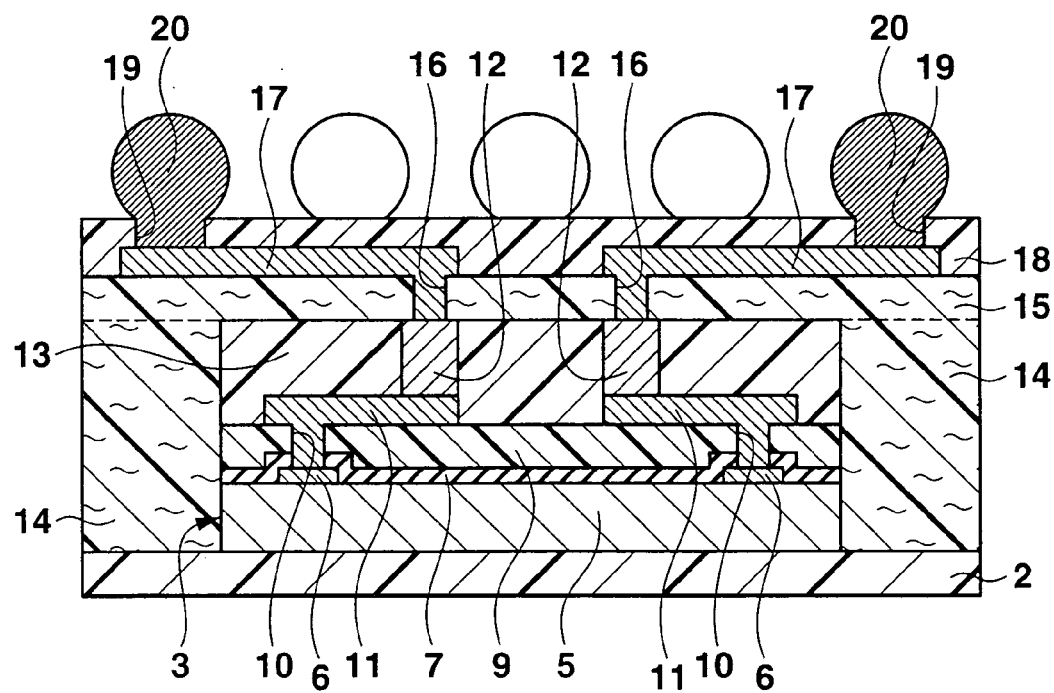
FIG. 35 is a sectional view of a semiconductor device according to the 15th embodiment of the present invention.

A semiconductor device according to the 15th embodiment shown in FIG. 35 indicates one embodiment manufactured by the latter method. Note that the embodiment aims at showing not that the structure shown in FIG. 35 can be obtained by the latter method but that a semiconductor device having one of the structures according to the already described first to 14th embodiments can also be manufactured by the latter method. This will be described in appropriate steps in the following description.

The semiconductor device shown in FIG. 35 is different from those of the first to 14th embodiments in that the lower surface of a semiconductor structure 3 directly sticks to an insulating layer 2 without intervening any adhesive layer. The insulating layer 2 is formed on the lower surface of the semiconductor structure 3 by printing or spin coating, as will be described later.

A method of manufacturing the semiconductor device according to the 15th embodiment will be described below.

With the steps shown in FIGS. 2 to 7, interconnections 11 and a sealing film 13 are formed on a silicon substrate 5 in a wafer state such that the interconnections 11 and sealing film 13 are flush with each other.

Figure 36:
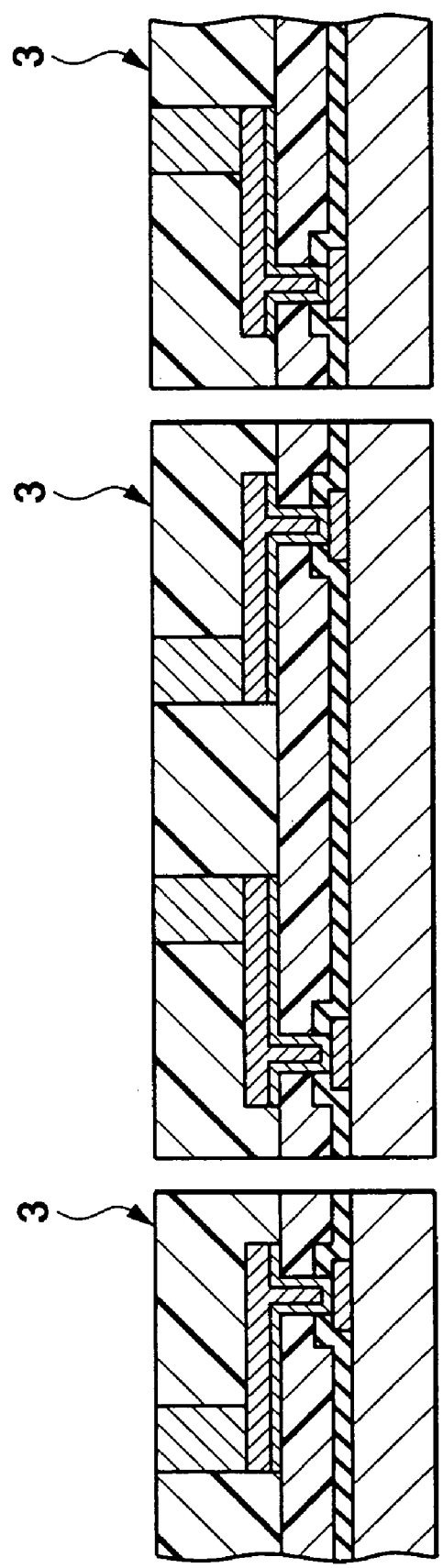
FIG. 36 is a sectional view for explaining a step of manufacturing the semiconductor device shown in FIG. 35.

In this state, without forming any adhesive layer on the lower surface of the silicon substrate 5, dicing is executed to obtain a plurality of semiconductor structures 3 shown in FIG. 35, as shown in FIG. 36.

Figure 37:
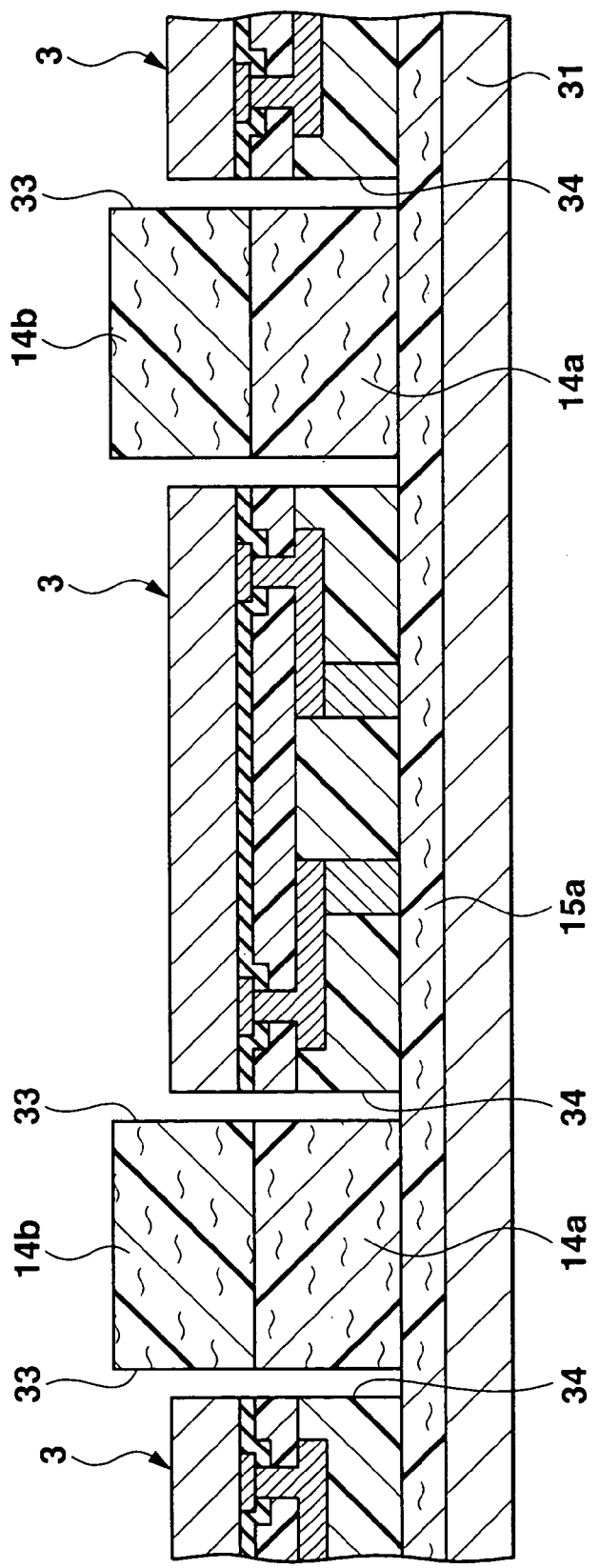
FIG. 37 is a sectional view showing a manufacturing step following FIG. 36.

As shown in FIG. 37, a base plate 31 is prepared. The base plate 31 has a size corresponding to a plurality of semiconductor devices shown in FIG. 35. The base plate 31 is made of a metal such as aluminum and has a rectangular planar shape and, more preferably, an almost square planar shape, though the shape is not limited. The base plate 31 may be made of an insulating material such as glass, ceramic, or a resin.

A second insulating sheet member 15a is bonded to the entire upper surface of the base plate 31. The second insulating sheet member 15a is preferably made of a build-up material, although the present invention is not limited to this. As the build-up material, a thermosetting resin such as epoxy resin or BT resin, which is mixed with a silica filler and semi-set, can be used. However, as the second insulating sheet member 15a, the above-described prepreg material or a material containing no filler or containing only a thermosetting resin may be used. The thermosetting resin is semi-set by heating and pressing, and the second insulating sheet member 15a is bonded to the entire upper surface of the base plate 31.

The semiconductor structures 3 shown in FIG. 36 are inverted and arranged, in a face-down state, at a plurality of predetermined positions of the upper surface of the second insulating sheet member 15a. The semiconductor structures 3 are heated and pressed to temporarily set the thermosetting resin in the second insulating sheet member 15a so that the lower surface of the second insulating sheet member 15a temporarily sticks to the upper surface of the base plate 31.

Two first insulating sheet members 14a and 14b each having opening portions arrayed in a matrix are aligned and stacked on the upper surface of the second insulating sheet member 15a between the semiconductor structures 3 and outside those arranged at the outermost positions. The first insulating sheet members 14a and 14b are obtained in the following way. Glass fiber is impregnated with a thermosetting resin such as epoxy resin. The thermosetting resin is semi-set to prepare a sheet-shaped prepreg material. A plurality of rectangular opening portions 33 are formed in the prepreg material by die cutting or etching.

In this case, to obtain flatness, each of the first insulating sheet members 14a and 14b must be a sheet-shaped member. However, the material need not always be a prepreg material. A thermosetting resin or a thermosetting resin in which a reinforcing material such as glass fiber or silica filler is dispersed may be used.

The size of the opening portion 33 of the first insulating sheet members 14a and 14b is slightly larger than that of the semiconductor structure 3. For this reason, gaps 34 are formed between the first insulating sheet members 14a and 14b and the semiconductor structures 3. The length of the gap 34 is, e.g., about 0.1 to 0.5 mm. The total thickness of the first insulating sheet members 14a and 14b is larger than the thickness of the semiconductor structure 3. The first insulating sheet members 14a and 14b are thick enough to sufficiently fill the gaps 34 when the first insulating sheet members are heated and pressed, as will be described later.

In this case, the first insulating sheet members 14a and 14b having the same thickness are used. However, the first insulating sheet members 14a and 14b may have different thicknesses. The second insulating sheet member may include two layers, as described above. However, it may include one layer or three or more layers. The thickness of the second insulating sheet member 15a corresponds to or is slightly larger than the thickness of a second insulating material 15 to be formed on the semiconductor structure 3 in FIG. 35.

Figure 38:
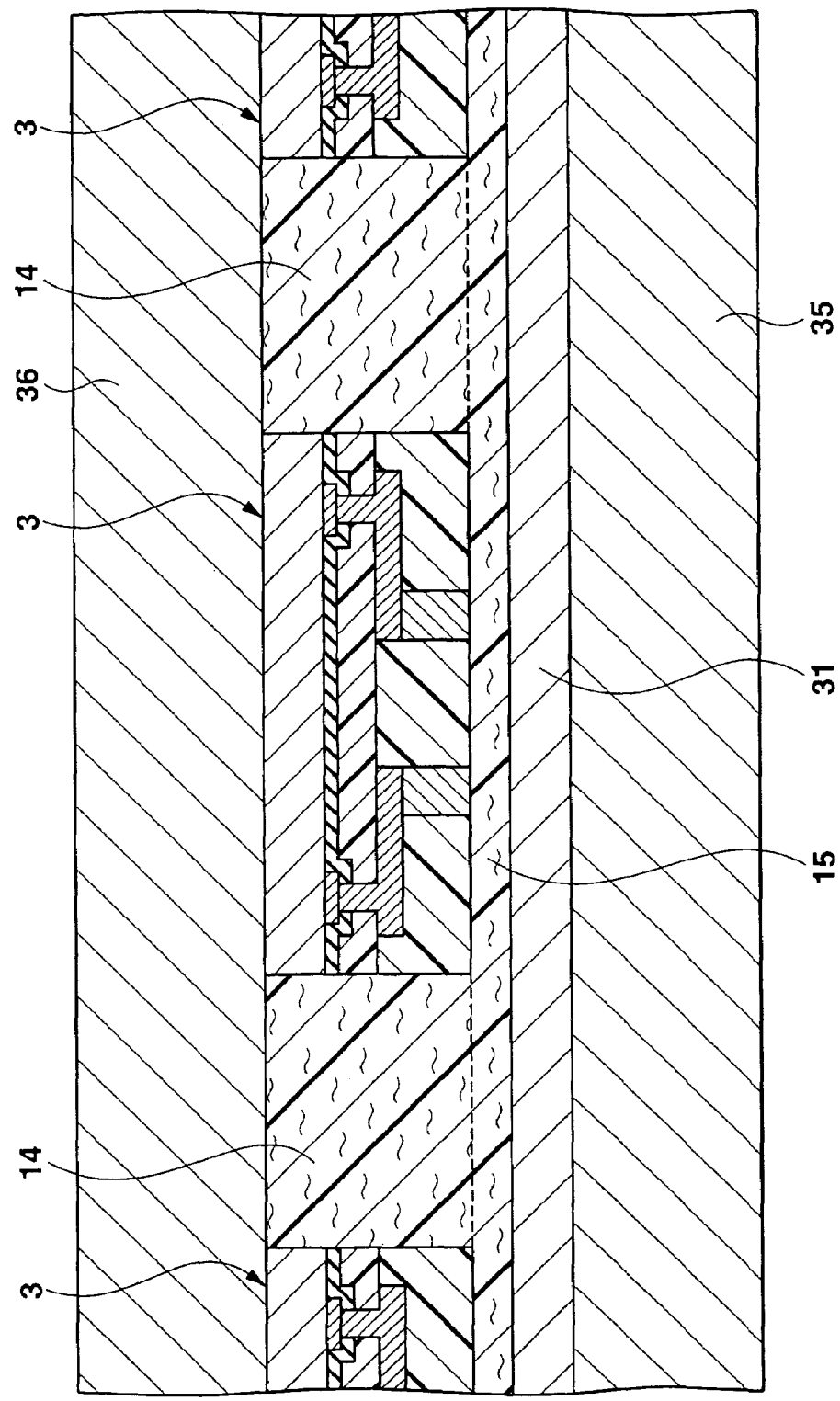
FIG. 38 is a sectional view showing a manufacturing step following FIG. 37.

Next, the second insulating sheet member 15a and first insulating sheet members 14a and 14b are heated and pressed by using a pair of heating/pressing plates 35 and 36 shown in FIG. 38. Accordingly, the melted thermosetting resin in the first insulating sheet members 14a and 14b is squeezed to fill the gaps 34, shown in FIG. 37, between the first insulating sheet members 14a and 14b and the semiconductor structures 3. With a subsequent cooling process, the thermosetting resin is set while sticking to the semiconductor structures 3. In this way, as shown in FIG. 38, the second insulating material 15 made of a thermosetting resin containing a reinforcing material is formed on and sticks to the upper surface of the base plate 31. In addition, the semiconductor structures 3 stick to the upper surface of the second insulating material 15. Furthermore, a first insulating material 14 made of a thermosetting resin containing a reinforcing material is formed on and sticks to the upper surface of the second insulating material 15.

In this case, as shown in FIG. 36, in the wafer state, columnar electrodes 12 in each semiconductor structure 3 have a uniform height. In addition, the upper surface of the sealing film 13 including the upper surfaces of the columnar electrodes 12 is planarized. For this reason, in the state shown in FIG. 38, the plurality of semiconductor structures 3 have the same thickness.

In the state shown in FIG. 38, heating and pressing are performed while defining, as a press limit surface, a virtual plane higher than the upper surface of the semiconductor structure 3 by the diameter of the reinforcing material (e.g., silica filler). The second insulating material 15 under the semiconductor structures 3 obtains a thickness equal to the diameter of the reinforcing material (e.g., silica filler). When an open-ended (open) flat press is used as a press having the pair of heating/pressing plates 35 and 36, the excess thermosetting resin in the insulating sheet members 14a, 14b, and 15a is squeezed out of the pair of heating/pressing plates 35 and 36.

As a result, the upper surface of the first insulating material 14 becomes flush with that of the semiconductor structure 3. The lower surface of the second insulating material 15 is flat because the surface is regulated by the upper surface of the heating/pressing plate 35 on the lower side. Hence, the polishing step of planarizing the upper surface of the first insulating material 14 and the lower surface of the second insulating material 15 is unnecessary. Even when the base plate 31 has a relatively large size of, e.g., about 500×500 mm, the first and second insulating materials 14 and 15 can easily be planarized at once with respect to the plurality of semiconductor structures 3 arranged on the base plate 31.

The first and second insulating materials 14 and 15 are made of a thermosetting resin containing a reinforcing material such as a fiber or filler. For this reason, as compared to a structure made of only a thermosetting resin, stress due to shrinkage in setting the thermosetting resin can be reduced. This also prevents the base plate 31 from warping.

In the manufacturing step shown in FIG. 38, heating and pressing may be executed by separate means. That is, for example, pressing is executed only from the upper surface side while the lower surface side of the base plate 31 is heated by a heater. Alternatively, heating and pressing may be executed in separate steps.

When the manufacturing step shown in FIG. 38 is ended, the semiconductor structures 3 and first and second insulating materials 14 and 15 are integrated. They alone can maintain a necessary strength. Next, the base plate 31 is removed by polishing or etching. This process is done to reduce the load in dicing (to be described later) and reduce the thickness of the semiconductor device as a product.

Figure 39:
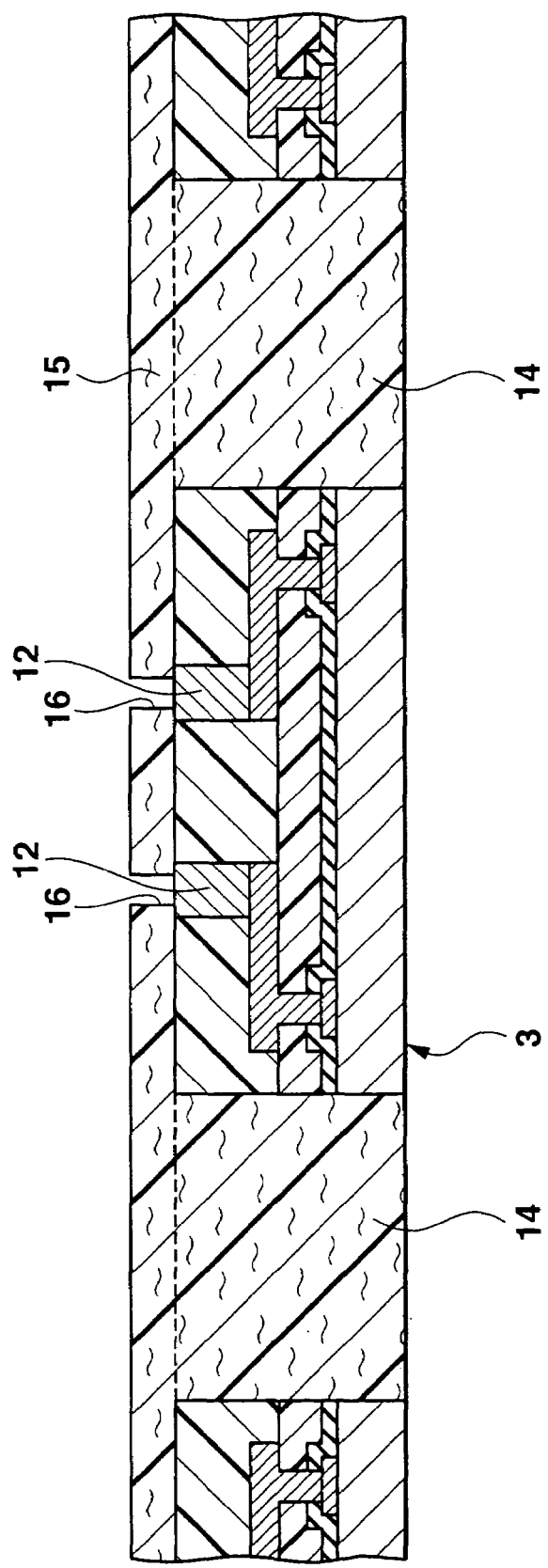
FIG. 39 is a sectional view showing a manufacturing step following FIG. 38.

Next, the resultant structure shown in FIG. 38, in which the semiconductor structures 3 and first and second insulating materials 14 and 15 are integrated, is inverted and set in a face-up state. As shown in FIG. 39, opening portions 16 are formed in the second insulating material 15 at positions corresponding to the central portions of the upper surfaces of the columnar electrodes 12 by laser machining for irradiating the second insulating material 15 with a laser beam. Then, epoxy smears generated in the opening portions 16 are removed by a desmearing process, as needed.

Figure 40:
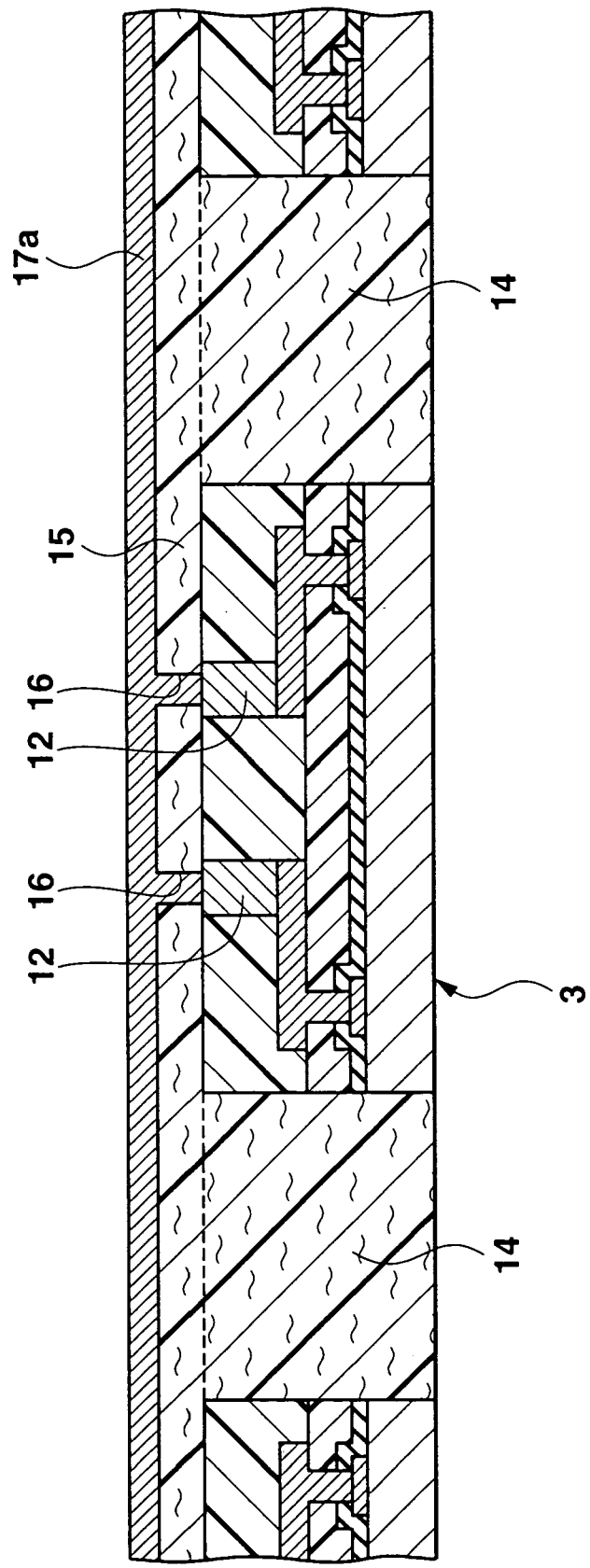
FIG. 40 is a sectional view showing a manufacturing step following FIG. 39.

As shown in FIG. 40, an upper interconnection formation layer 17a is formed on the entire upper surface of the second insulating material 15, including the upper surfaces of the columnar electrodes 12 exposed through the opening portions 16. In this case, the upper interconnection formation layer 17a includes a lower metal layer formed from, e.g., a copper layer made by electroless plating and an upper metal layer formed on the surface of the lower metal layer by executing copper electroplating using the lower metal layer as a plating current path.

Figure 41:
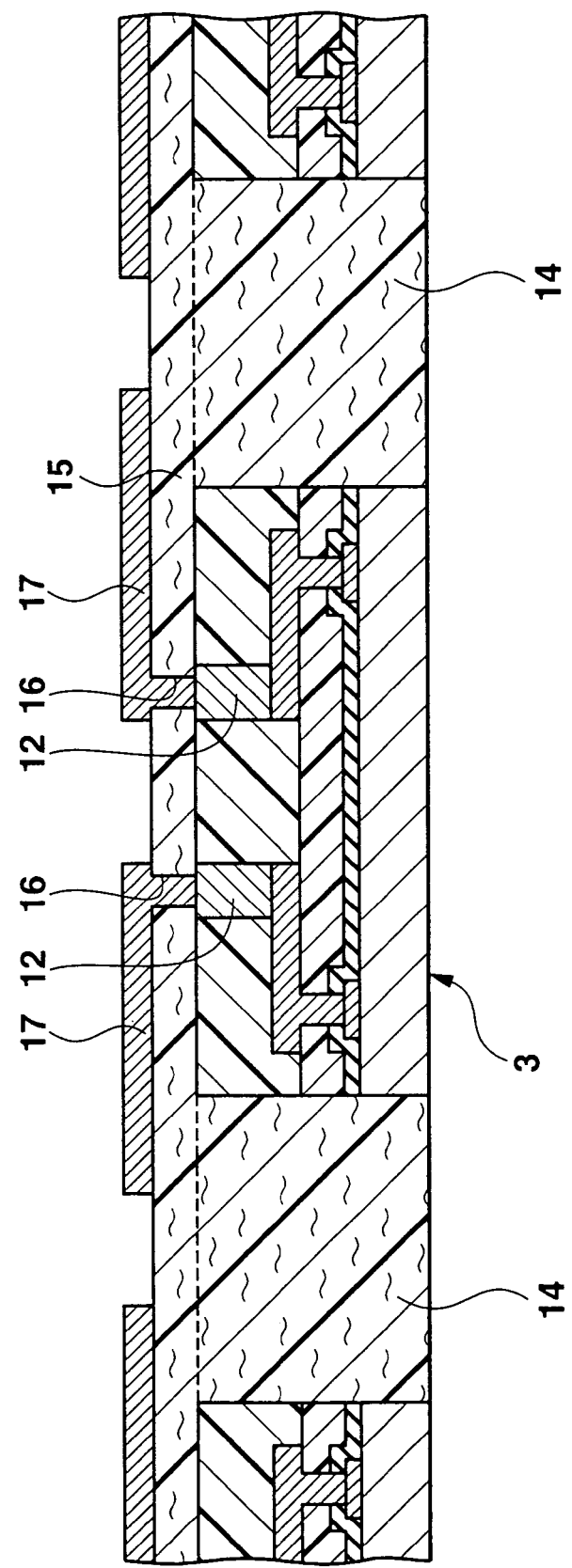
FIG. 41 is a sectional view showing a manufacturing step following FIG. 40.

When the upper interconnection formation layer 17*a* is patterned by photolithography, upper interconnections 17 are formed at predetermined positions of the upper surface of the second insulating material 15, as shown in FIG. 41. In this state, the upper interconnections 17 are connected to the upper surfaces of the columnar electrodes 12 through the opening portions 16 of the second insulating material 15.

Figure 42:
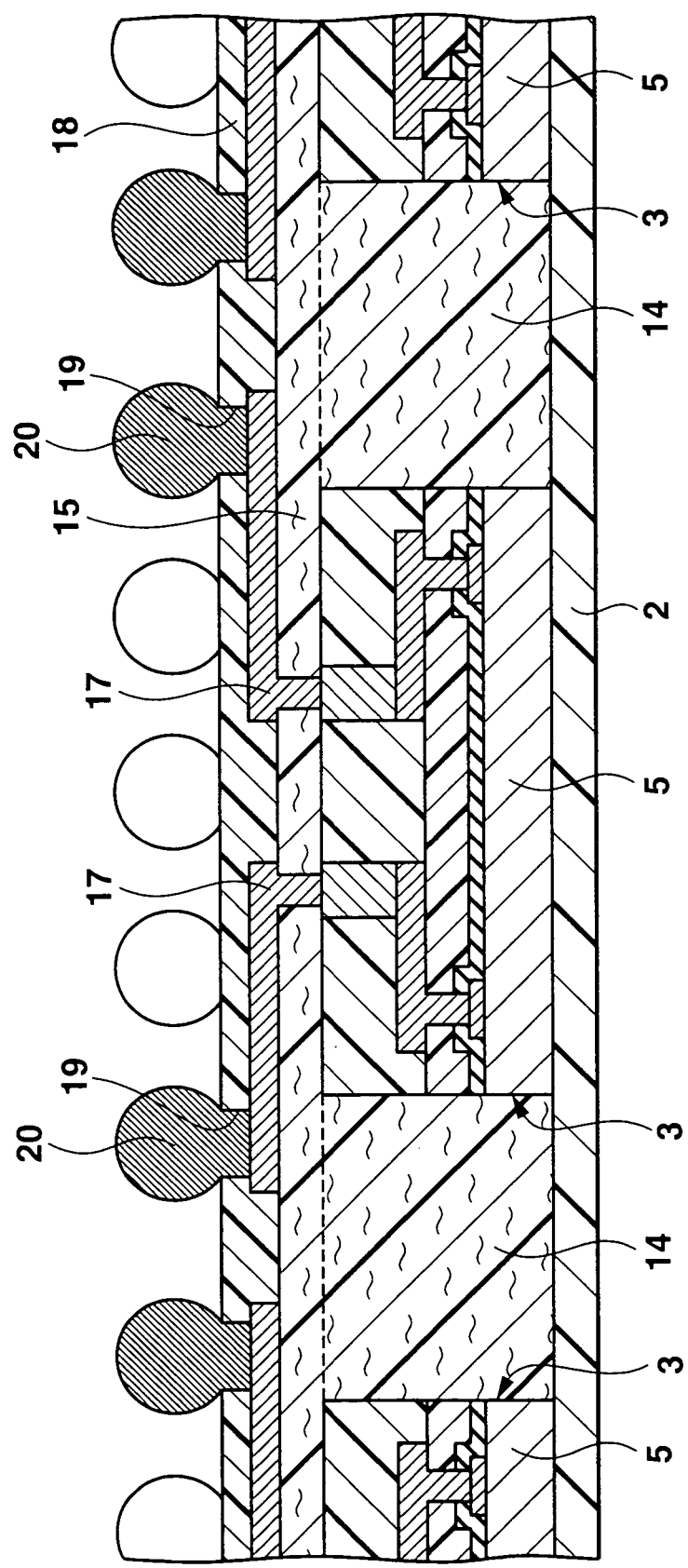
FIG. 42 is a sectional view showing a manufacturing step following FIG. 41.

As shown in FIG. 42, an upper insulating film 18 made of a solder resist is formed on the entire upper surface of the second insulating material 15 including the upper interconnections 17 by screen printing or spin coating. In this case, the upper insulating film 18 has opening portions 19 at positions corresponding to the connection pad portions of the upper interconnections 17. In addition, the insulating layer 2 made of a solder resist is formed on the lower surfaces of the silicon substrate 5 and first insulating material 14 by printing or spin coating. Next, projecting electrodes 20 are formed in and on the opening portions 19 and connected to the connection pad portions of the upper interconnections 17.

Figure 43:
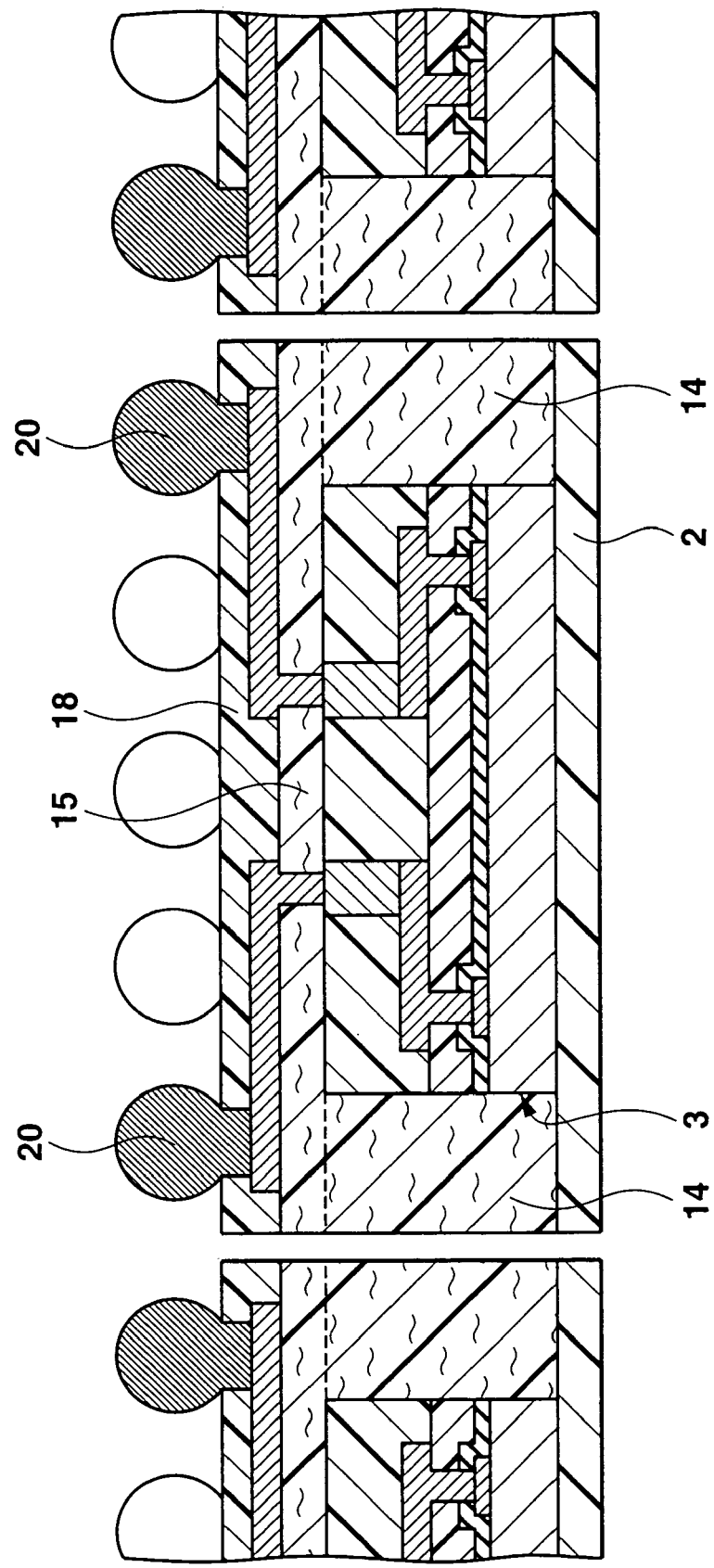
FIG. 43 is a sectional view showing a manufacturing step following FIG. 42.

As shown in FIG. 43, when the upper insulating film 18, first and second insulating materials 14 and 15, and insulating layer 2 are cut between the adjacent semiconductor structures 3, a plurality of semiconductor devices shown in FIG. 35 are obtained.

In the semiconductor device thus obtained, the upper interconnections 17 to be connected to the columnar electrodes 12 of the semiconductor structure 3 are formed by electroless plating (or sputtering) and electroplating. For this reason, conductive connection between each upper interconnection 17 and a corresponding columnar electrode 12 of the semiconductor structure 3 can reliably be ensured. In the state shown in FIG. 41, when the insulating layer 2 having a metal layer 1 is bonded by an adhesive layer instead of forming the insulating layer 2 on the lower surfaces of the silicon substrate 5 and first insulating material 14, the semiconductor device according to the first embodiment shown in FIG. 1 can be obtained. It can sufficiently be understood that the semiconductor device according to any one of the second to 14th embodiment except the first embodiment can also be obtained, although a specific description will be omitted.

In the above manufacturing method, the plurality of semiconductor structures 3 are arranged on the second insulating sheet member 15*a* arranged on the base plate 31. The first and second insulating materials 14 and 15 are formed at once for the plurality of semiconductor structures 3. Next, the base plate 31 is removed. Then, the upper interconnections 17, upper insulating film 18, and projecting electrodes 20 are formed at once for the plurality of semiconductor structures 3. After that, the semiconductor structures are separated to obtain a plurality of semiconductor devices. Hence, the manufacturing step can be simplified.

In addition, from the manufacturing step shown in FIG. 38, the plurality of semiconductor structures 3 can be transported together with the first and second insulating materials 14 and 15 even when the base plate 31 is removed. This also simplifies the manufacturing step. Furthermore, in the above manufacturing method, as shown in FIG. 37, the semiconductor structure 3 sticks to the base plate 31 via the second insulating sheet member 15*a*. Hence, the process for forming an adhesive difference is unnecessary. In removing the base plate 31, only the base plate 31 needs to be removed. This also simplifies the manufacturing step.

In the above-described embodiment, the projecting electrodes 20 are arrayed in a matrix in correspondence with the entire surfaces of the semiconductor structures 3 and first insulating material 14 around it. However, the projecting electrodes 20 may be arranged only on a region corresponding to the first insulating material 14 around the semiconductor structure 3. The projecting electrodes 20 may be formed not totally around the semiconductor structure 3 but on only one to three sides of the four sides of the semiconductor structure 3. In this case, the first insulating material 14 need not have a rectangular frame shape and may be arranged on only a side where the projecting electrodes 20 are to be formed.

(16th Embodiment)

Figure 44:
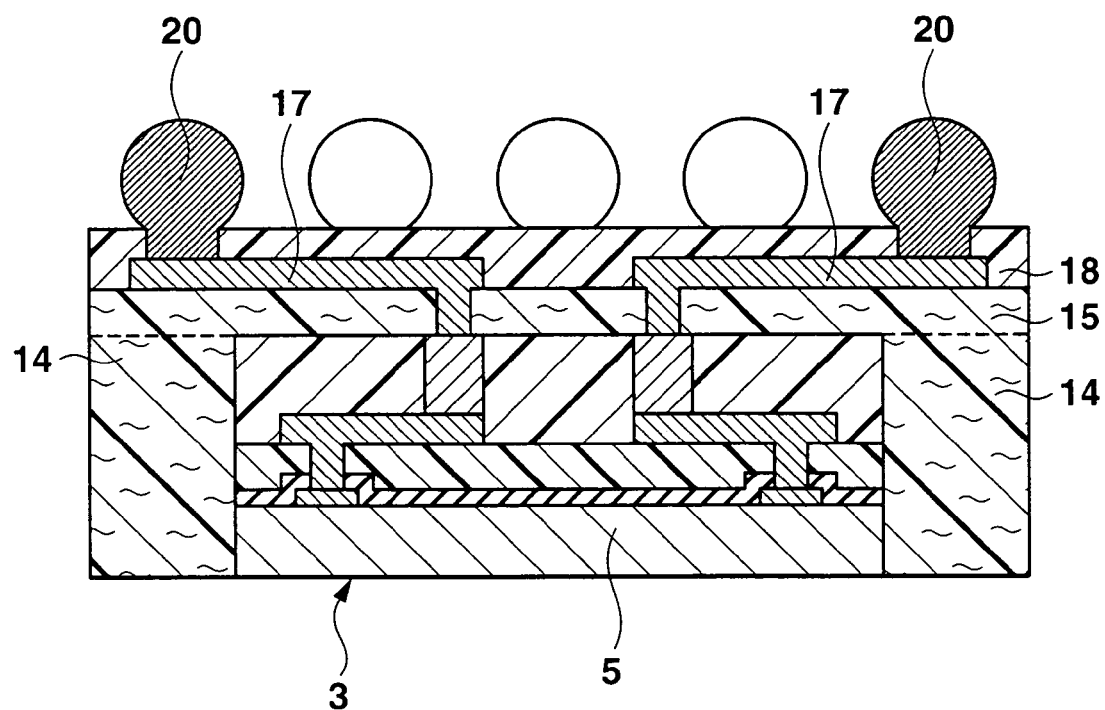
FIG. 44 is a sectional view of a semiconductor device according to the 16th embodiment of the present invention.

FIG. 44 is a sectional view of a semiconductor device according to the 16th embodiment of the present invention. This semiconductor device is different from that shown in FIG. 35 in that it has no insulating layer 2.

In manufacturing the semiconductor device according to the 16th embodiment, in the manufacturing step shown in FIG. 42, no insulating layer 2 is formed on the lower surfaces of a silicon substrate 5 and first insulating material 14. After projecting electrodes 20 are formed, an upper insulating film 18 and first and second insulating materials 14 and 15 are cut between adjacent semiconductor structures 3. Accordingly, a plurality of semiconductor devices shown in FIG. 44 are obtained. The semiconductor device thus obtained can be thin because it has no insulating layer 2.

(17th Embodiment)

Figure 45:
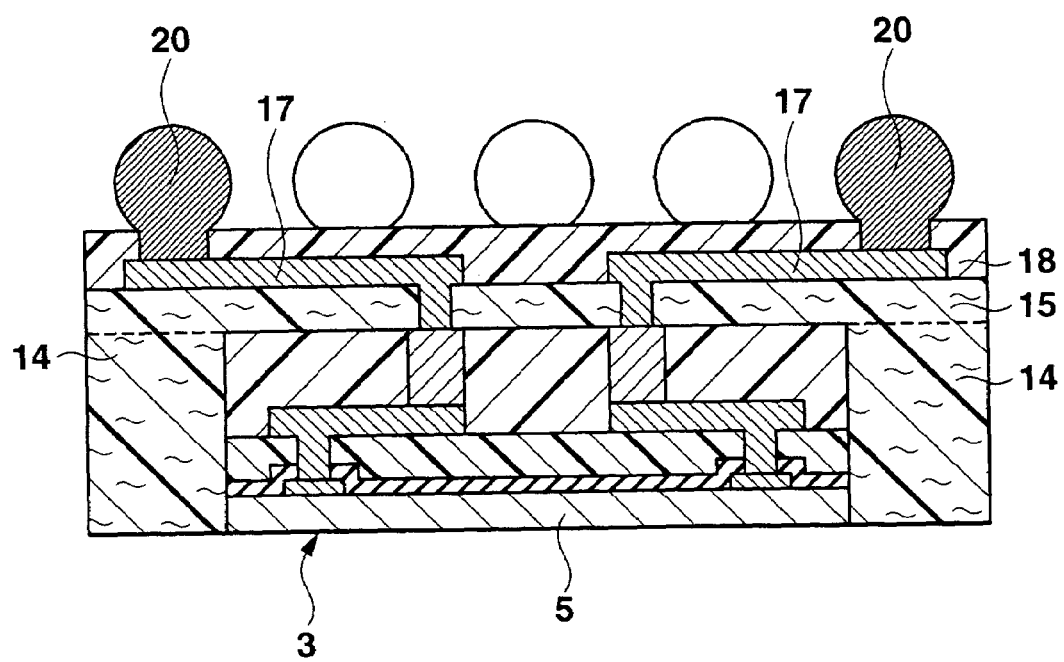
FIG. 45 is a sectional view of a semiconductor device according to the 17th embodiment of the present invention.

FIG. 45 is a sectional view of a semiconductor device according to the 17th embodiment of the present invention. This semiconductor device can be obtained by, e.g., in the state shown in FIG. 44, appropriately polishing the lower surface side of a silicon substrate 5 and first insulating material 14 and cutting an upper insulating film 18 and first and second insulating materials 14 and 15 between adjacent semiconductor structures 3. The semiconductor device thus obtained can be thinner.

Before formation of projecting electrodes 20, an insulating layer 2 may be removed by polishing or etching (and the lower surface side of the silicon substrate 5 and first insulating material 14 may be appropriately polished, as needed). Then, projecting electrodes 20 may be formed, and the upper insulating film 18 and first insulating material 14 may be cut between adjacent semiconductor structures 3.

(18th Embodiment)

Figure 46:
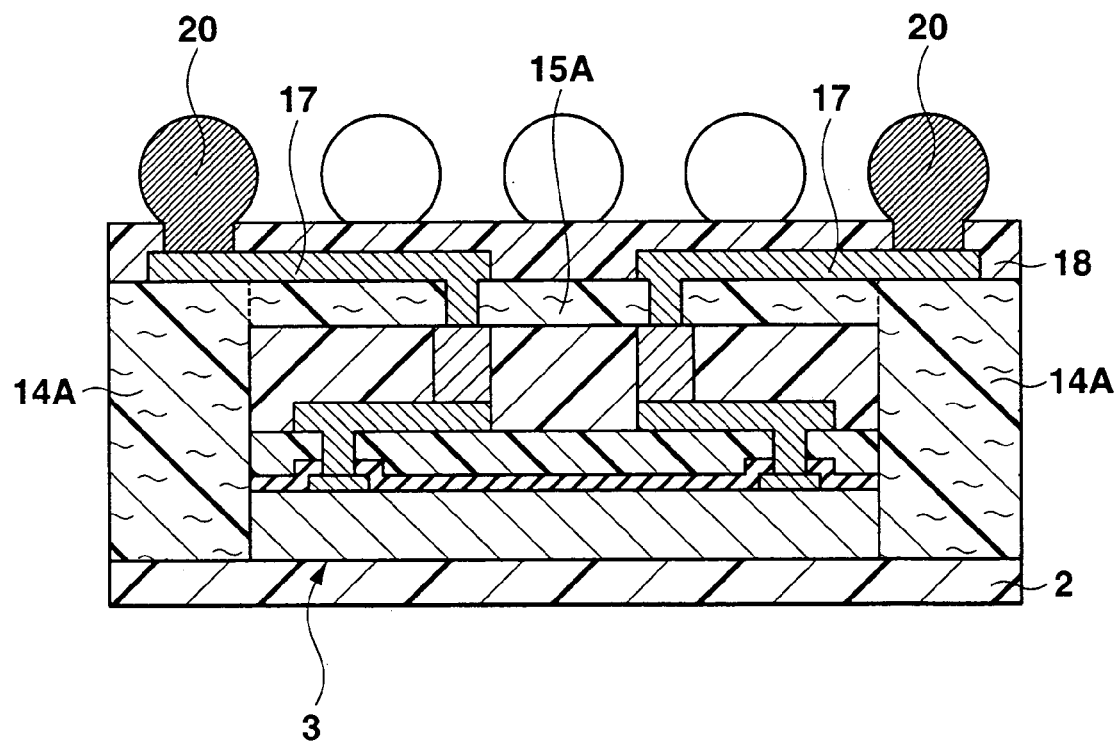
FIG. 46 is a sectional view of a semiconductor device according to the 18th embodiment of the present invention.

FIG. 46 is a sectional view of a semiconductor device according to the 18th embodiment of the present invention. This semiconductor device is different from that shown in FIG. 35 in that a second insulating material 15A is arranged on the upper surface of a semiconductor structure 3, and a first insulating material 14A is arranged on the upper surface of an insulating layer 2 around the semiconductor structure 3 and second insulating material 15A.

Figure 47:
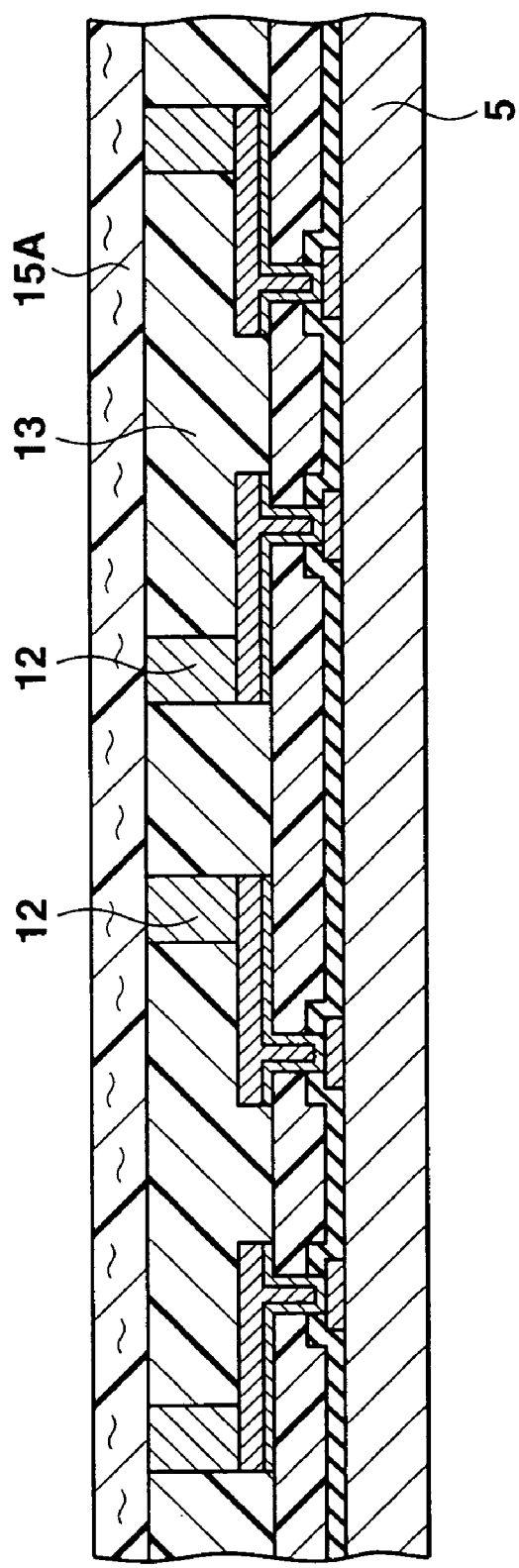
FIG. 47 is a sectional view for explaining a step of manufacturing the semiconductor device shown in FIG. 46.

In manufacturing the semiconductor device according to the 18th embodiment, after the manufacturing step shown in FIG. 7, the sheet-shaped first insulating sheet member 15A is bonded to the entire upper surface of a sealing film 13 including the upper surfaces of columnar electrodes 12, as shown in FIG. 47.

Figure 48:
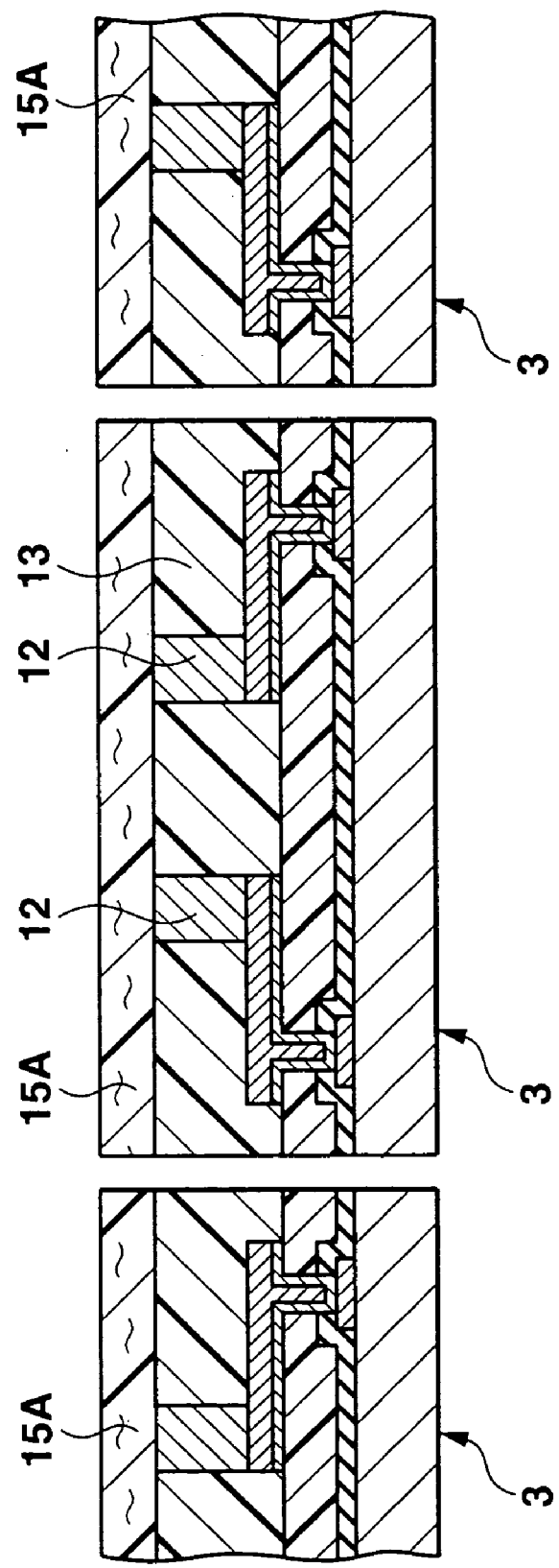
FIG. 48 is a sectional view showing a manufacturing step following FIG. 47.

Next, as shown in FIG. 48, a dicing step is executed to obtain a plurality of semiconductor structures 3. In this case, however, the first insulating sheet member 15A is bonded to the upper surface of the sealing film 13 including the upper surfaces of the columnar electrode 12 of the semiconductor structure 3. The semiconductor structure 3 thus obtained has the sheet-shaped first insulating sheet member 15A on its upper surface. Hence, the very cumbersome operation for bonding the first insulating sheet member 15A to the upper surface of each semiconductor structure 3 after the dicing step is unnecessary.

Figure 49:
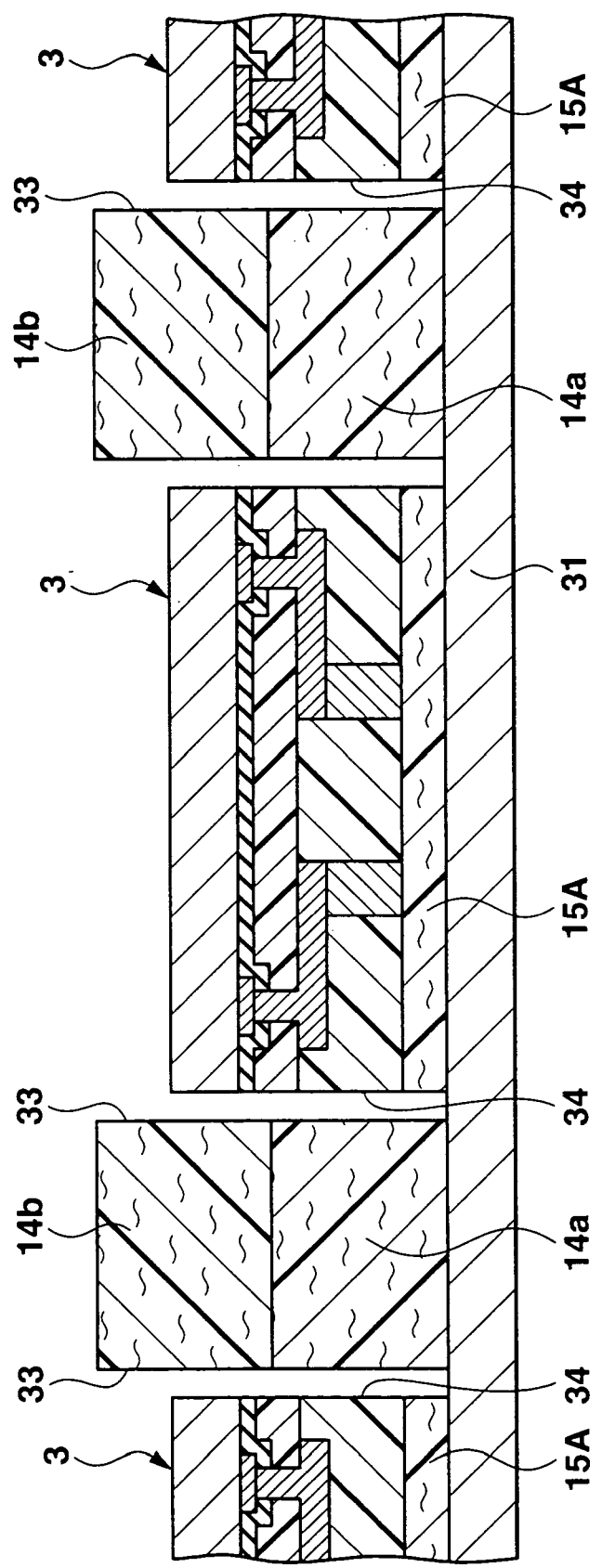
FIG. 49 is a sectional view showing a manufacturing step following FIG. 48.

As shown in FIG. 49, the semiconductor structures 3 shown in FIG. 48 are inverted and set in a face-down state so that the first insulating sheet members 15A bonded to the lower surfaces of the semiconductor structures 3 are bonded to a plurality of predetermined positions of the upper surface of a base plate 31 by using the appropriate viscosity of the first insulating sheet member 15A. Heating and pressing are performed to temporarily set the thermosetting resin in the first insulating sheet member 15A so that the lower surface of the first insulating sheet member 15A temporarily sticks to the upper surface of the base plate 31. In addition, the lower surface of the semiconductor structure 3 temporarily sticks to the upper surface of the first insulating sheet member 15A. Two first insulating sheet members 14a and 14b each having opening portions 33 are aligned and stacked on the upper surface of the base plate 31 between the semiconductor structures 3 and outside those arranged at the outermost positions.

In this case as well, the size of the opening portion 33 of the first insulating sheet members 14a and 14b is slightly larger than that of the semiconductor structure 3. For this reason, gaps 34 are formed between the first insulating sheet members 14a and 14b and the semiconductor structures 3 including the first insulating sheet members 15A. The length of the gap 34 is, e.g., about 0.1 to 0.5 mm. The total thickness of the first insulating sheet members 14a and 14b is larger than the thickness of the semiconductor structure 3 including the first insulating sheet member 15A. The first insulating sheet members 14a and 14b are thick enough to sufficiently fill the gaps 34 when the first insulating sheet members are heated and pressed, as will be described later.

Figure 50:
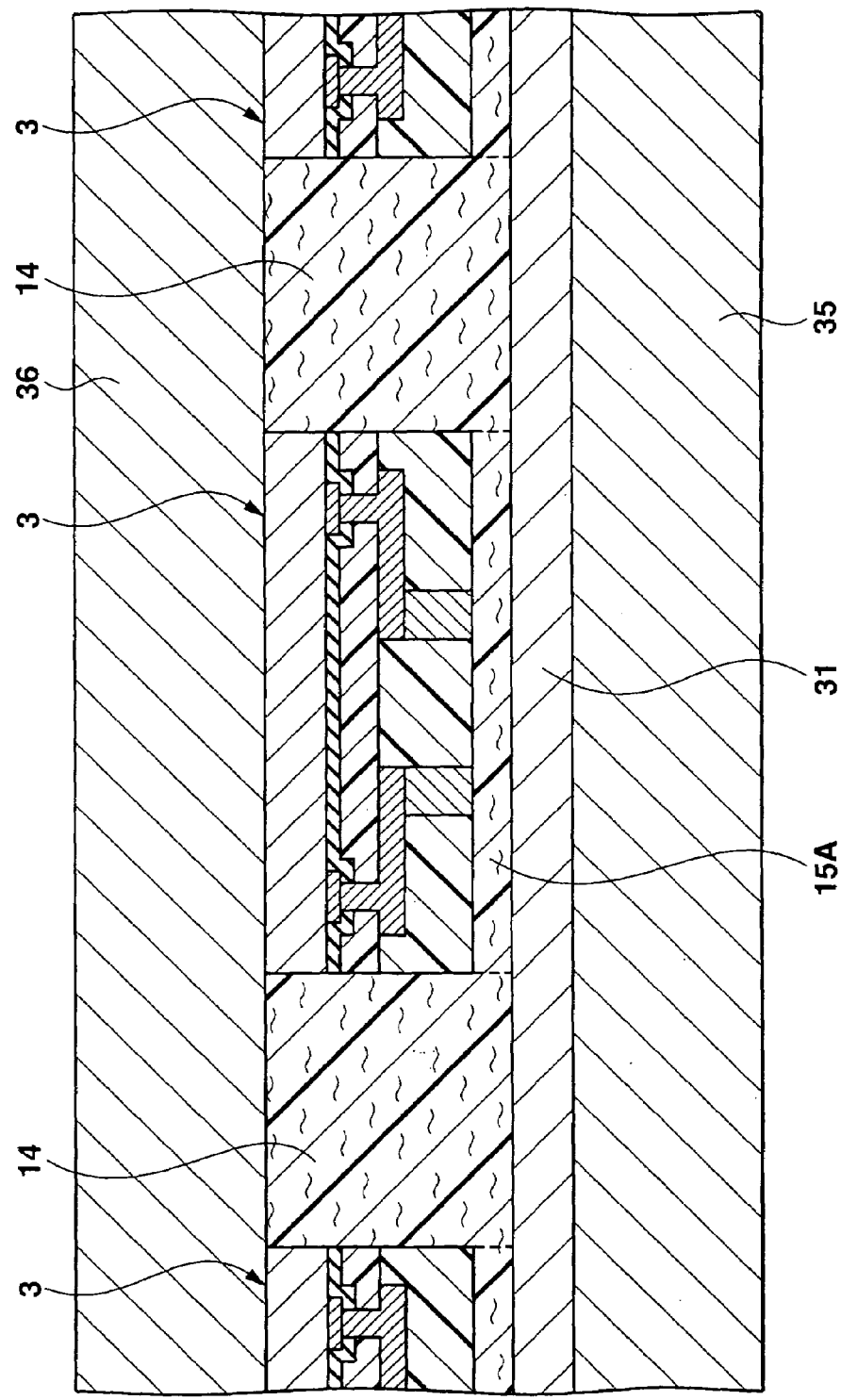
FIG. 50 is a sectional view showing a manufacturing step following FIG. 49.

Next, the first insulating sheet member 15A and first insulating sheet members 14a and 14b are heated and pressed by using a pair of heating/pressing plates 35 and 36 shown in FIG. 50. Accordingly, the melted thermosetting resin in the first insulating sheet members 14a and 14b is squeezed to fill the gaps 34, shown in FIG. 49, between the first insulating sheet members 14a and 14b and the semiconductor structures 3 including the first insulating sheet members 15A. With a subsequent cooling process, the thermosetting resin is set while sticking to the semiconductor structures 3 and the base plate 31 between them.

In this way, as shown in FIG. 50, the second insulating material 15A made of a thermosetting resin containing a reinforcing material is formed at and sticks to a plurality of predetermined positions of the upper surface of the base plate 31. In addition, the semiconductor structures 3 stick to the upper surface of the second insulating material 15A. Furthermore, a first insulating material 14 made of a thermosetting resin containing a reinforcing material is formed on and sticks to the upper surface of the base plate 31 between the semiconductor structures 3 and outside those arranged at the outermost positions. With the same manufacturing step as in the 15th embodiment, the semiconductor device shown in FIG. 46 is obtained.

In the above embodiments, the semiconductor structure 3 has, as an external connection electrode, the interconnection 11 and columnar electrode 12 in addition to the connection pad 6. The present invention can also be applied to the semiconductor structure 3 which has, as an external connection electrode, only the connection pad 6 or the connection pad 6 and interconnection 11 having a connection pad portion.

As has been described above, according to the present invention, the connection pad portions of at least some of the uppermost upper interconnections are arranged on the first insulating material formed on a side of the semiconductor structure. For this reason, even when the number of connection pad portions of the uppermost upper interconnections increases, a necessary size and pitch can be ensured.

What is claimed is:

1. A semiconductor device comprising:
    at least one semiconductor structure which includes: (i) a semiconductor substrate, (ii) a plurality of external connection electrodes which are formed on the semiconductor substrate and each of which includes a connection pad and a columnar connection electrode connected to the connection pad, and (iii) a sealing film formed around the columnar connection electrodes;
    an insulating sheet member arranged on one side of the semiconductor structure; and
    a plurality of upper interconnections which include connection pad portions that are arranged on the insulating sheet member and electrically connected to the external connection electrodes of the semiconductor structure;
    wherein the insulating sheet member has a multilayered structure including a plurality of insulating sheet members.

2. A semiconductor device according to claim 1, wherein the semiconductor device comprises a plurality of said semiconductor structures.

3. A semiconductor device according to claim 1, wherein at least one of the insulating sheet members of the multilayered structure of the insulating sheet member consists essentially of a material prepared by impregnating fibers with a thermosetting resin.

4. A semiconductor device according to claim 1, wherein the plurality of insulating sheet members of the multilayered structure comprise a first insulating sheet member arranged at least beside the semiconductor structure and a second insulating sheet member formed between the first insulating sheet member and the upper interconnections and between the upper interconnections and the semiconductor structure.

5. A semiconductor device according to claim 4, wherein an upper surface of the second insulating sheet member is flat.

6. A semiconductor device according to claim 1, further comprising an upper insulating film which covers a portion except the connection pad portions of the upper interconnections.

7. A semiconductor device according to claim 6, further comprising a solder ball formed on each of the connection pad portions of the upper interconnections.

8. A semiconductor device according to claim 1, further comprising a metal layer formed on lower surfaces of the semiconductor structure and the insulating sheet member.

9. A semiconductor device according to claim 8, further comprising an insulating layer formed on a lower surface of the metal layer.

10. A semiconductor device according to claim 8, wherein the metal layer includes a metal foil.

11. A semiconductor device according to claim 10, wherein the metal foil is a copper foil.

12. A semiconductor device according to claim 1, further comprising a lower interconnection formed on at least a lower surface of the insulating sheet member, wherein one of the upper interconnections is connected to the lower interconnection through a vertical electrical connection portion formed in the insulating sheet member.

13. A semiconductor device according to claim 1, wherein the plurality of insulating sheet members of the multilayered structure comprise a first insulating sheet member having an upper surface that is flush with an upper surface of the semiconductor substrate, and a second insulating sheet member formed between the first insulating sheet member and the upper interconnections.

14. A semiconductor device comprising:
- at least one semiconductor structure which includes a semiconductor substrate and a plurality of external connection electrodes formed on the semiconductor substrate;
- an insulating sheet member arranged on one side of the semiconductor structure;
- a plurality of upper interconnections which include connection pad portions that are arranged on the insulating sheet member and electrically connected to the external connection electrodes of the semiconductor structure;
- a metal layer formed on lower surfaces of the semiconductor structure and the insulating sheet member; and
- an insulating layer formed on a lower surface of the metal layer.

15. A semiconductor device according to claim 14, wherein the semiconductor device comprises a plurality of said semiconductor structures.

16. A semiconductor device according to claim 14, wherein each of the external connection electrodes of the semiconductor substrate includes a connection pad and a columnar connection electrode connected to the connection pad, and wherein the semiconductor substrate further comprises a sealing film formed around the columnar connection electrodes.

17. A semiconductor device according to claim 14, wherein the insulating sheet member consists essentially of a material prepared by impregnating fibers with a thermosetting resin.

18. A semiconductor device according to claim 14, further comprising an insulating material formed between the insulating sheet member and the upper interconnections and between the upper interconnections and the semiconductor structure.

19. A semiconductor device according to claim 18, wherein the insulating material comprises a sheet member.

20. A semiconductor device according to claim 18, wherein an upper surface of the insulating material is flat.

21. A semiconductor device according to claim 14, further comprising an upper insulating film which covers a portion except the connection pad portions of the upper interconnections.

22. A semiconductor device according to claim 21, further comprising a solder ball formed on each of the connection pad portions of the upper interconnections.

23. A semiconductor device according to claim 14, wherein the metal layer includes a metal foil.

24. A semiconductor device according to claim 23, wherein the metal foil is a copper foil.

25. A semiconductor device comprising:
- at least one semiconductor structure which includes a semiconductor substrate and a plurality of external connection electrodes formed on the semiconductor substrate;
- an insulating sheet member arranged on one side of the semiconductor structure;
- a plurality of upper interconnections which include connection pad portions that are arranged on the insulating sheet member and electrically connected to the external connection electrodes of the semiconductor structure; and
- a lower interconnection formed on at least a lower surface of the insulating sheet member;
- wherein one of the upper interconnections is connected to the lower interconnection through a vertical electrical connection portion formed in the insulating sheet member.

26. A semiconductor device according to claim 25, wherein the semiconductor device comprises a plurality of said semiconductor structures.

27. A semiconductor device according to claim 25, wherein each of the external connection electrodes of the semiconductor substrate includes a connection pad and a columnar connection electrode connected to the connection pad, and wherein the semiconductor substrate further comprises a sealing film formed around the columnar connection electrodes.

28. A semiconductor device according to claim 25, wherein the insulating sheet member consists essentially of a material prepared by impregnating fibers with a thermosetting resin.

29. A semiconductor device according to claim 25, further comprising an insulating material formed between the insulating sheet member and the upper interconnections and between the upper interconnections and the semiconductor structure.

30. A semiconductor device according to claim 29, wherein the insulating material comprises a sheet member.

31. A semiconductor device according to claim 29, wherein an upper surface of the insulating material is flat.

32. A semiconductor device according to claim 25, further comprising an upper insulating film which covers a portion except the connection pad portions of the upper interconnections.

33. A semiconductor device according to claim 32, further comprising a solder ball formed on each of the connection pad portions of the upper interconnections.

34. A semiconductor device according to claim 25, wherein the insulating sheet member has a multilayered structure including a plurality of insulating sheet members.

35. A semiconductor device comprising:
- at least one semiconductor structure which includes: (i) a semiconductor substrate, (ii) a plurality of external connection electrodes which are formed on the semiconductor substrate and each of which includes a connection pad and a columnar connection electrode connected to the connection pad, and (iii) a sealing film formed around the columnar connection electrodes;
- an insulating sheet member arranged on one side of the semiconductor structure;
- a plurality of upper interconnections which include connection pad portions that are arranged on the insulating sheet member and electrically connected to the external connection electrodes of the semiconductor structure;
- a metal layer formed on lower surfaces of the semiconductor structure and the insulating sheet member; and
- an insulating layer formed on a lower surface of the metal layer.

36. A semiconductor device comprising:
- at least one semiconductor structure which includes: (i) a semiconductor substrate, (ii) a plurality of external connection electrodes which are formed on the semiconductor substrate and each of which includes a connection pad and a columnar connection electrode connected to the connection pad, and (iii) a sealing film formed around the columnar connection electrodes;

an insulating sheet member arranged on one side of the semiconductor structure;
a plurality of upper interconnections which include connection pad portions that are arranged on the insulating sheet member and electrically connected to the external connection electrodes of the semiconductor structure; and a lower interconnection formed on at least a lower surface of the insulating sheet member, wherein one of the upper interconnections is connected to the lower interconnection through a vertical electrical connection portion formed in the insulating sheet member.

* * * * *